(12) United States Patent
Saeiki

(10) Patent No.: US 11,411,561 B2
(45) Date of Patent: Aug. 9, 2022

(54) SEMICONDUCTOR CIRCUIT AND SEMICONDUCTOR SYSTEM

(71) Applicant: SONY SEMICONDUCTOR SOLUTIONS CORPORATION, Kanagawa (JP)

(72) Inventor: Takanori Saeiki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/285,536

(22) PCT Filed: Aug. 9, 2019

(86) PCT No.: PCT/JP2019/031703
§ 371 (c)(1),
(2) Date: Apr. 15, 2021

(87) PCT Pub. No.: WO2020/084872
PCT Pub. Date: Apr. 30, 2020

(65) Prior Publication Data
US 2021/0384907 A1 Dec. 9, 2021

(30) Foreign Application Priority Data
Oct. 24, 2018 (JP) .............................. JP2018-199663

(51) Int. Cl.
*H03K 3/00* (2006.01)
*H03K 5/02* (2006.01)
(Continued)

(52) U.S. Cl.
CPC . *H03K 19/018521* (2013.01); *H03K 3/35613* (2013.01); *H03K 17/162* (2013.01)

(58) Field of Classification Search
None
See application file for complete search history.

(56) References Cited

U.S. PATENT DOCUMENTS

| 5,638,328 A | 6/1997 | Cho |
| 6,201,743 B1 | 3/2001 | Kuroki |
| (Continued) | | |

FOREIGN PATENT DOCUMENTS

| CN | 101110589 A | 1/2008 |
| EP | 0855719 A1 | 7/1998 |
| | (Continued) | |

OTHER PUBLICATIONS

International Search Report and Written Opinion of PCT Application No. PCT/JP2019/031703, dated Nov. 5, 2019, 14 pages of ISRWO.

*Primary Examiner* — Kenneth B Wells
(74) *Attorney, Agent, or Firm* — Chip Law Group

(57) ABSTRACT

A signal is caused to have a small amplitude without increasing a voltage source, and power consumption is reduced. A semiconductor circuit includes a driver, and a pulse control circuit that controls the driver. The driver has a configuration in which first and second transistors are connected. The pulse control circuit supplies a first control signal to the first transistor, and supplies a second control signal to the second transistor. The first and second control signals to be supplied from the pulse control circuit are different in a pulse width from each other. Therefore, the pulse control circuit reduces an output amplitude of the driver.

11 Claims, 18 Drawing Sheets

(51) Int. Cl.
*H03K 17/687* (2006.01)
*H03K 19/094* (2006.01)
*H02M 1/08* (2006.01)
*H03K 19/0185* (2006.01)
*H03K 3/356* (2006.01)
*H03K 17/16* (2006.01)

(56) References Cited

U.S. PATENT DOCUMENTS

| | | | | |
|---|---|---|---|---|
| 6,225,838 | B1* | 5/2001 | Lee | H03K 19/0016 327/108 |
| 6,304,120 | B1* | 10/2001 | Taito | H03K 5/08 327/112 |
| 6,489,808 | B2* | 12/2002 | Iizuka | H03K 19/01707 326/56 |
| 7,176,722 | B2* | 2/2007 | Park | H03K 19/0016 326/83 |
| 8,552,768 | B2* | 10/2013 | Lee | H02M 1/38 327/108 |
| 8,692,577 | B2* | 4/2014 | Takayama | H03K 19/0013 326/83 |
| 8,982,657 | B2* | 3/2015 | Jung | G11C 8/08 365/226 |
| 9,263,109 | B2* | 2/2016 | Kushiyama | G11C 7/1069 |
| 2002/0180495 | A1* | 12/2002 | Motoyui | H03K 19/0013 327/108 |
| 2008/0048713 | A1 | 2/2008 | Saito | |
| 2014/0002141 | A1* | 1/2014 | Barrenscheen | H02M 1/08 327/108 |

FOREIGN PATENT DOCUMENTS

| | | |
|---|---|---|
| JP | 07-154231 A | 6/1995 |
| JP | 08-335395 A | 12/1996 |
| JP | 3927788 B2 | 6/2007 |
| JP | 2008-028578 A | 2/2008 |
| KR | 10-0135323 B1 | 5/1998 |
| WO | 1998/005036 A1 | 2/1998 |

* cited by examiner

SEMICONDUCTOR CIRCUIT AND SEMICONDUCTOR SYSTEM

CROSS REFERENCE TO RELATED APPLICATIONS

This application is a U.S. National Phase of International Patent Application No. PCT/JP2019/031703 filed on Aug. 9, 2019, which claims priority benefit of Japanese Patent Application No. JP 2018-199663 filed in the Japan Patent Office on Oct. 24, 2018. Each of the above-referenced applications is hereby incorporated herein by reference in its entirety.

TECHNICAL FIELD

The present technology relates to a semiconductor circuit. Specifically, the present technology relates to a semiconductor circuit and a semiconductor system that operate according to a small-amplitude signal.

BACKGROUND ART

An increase in the degree of integration and an increase in an operation frequency in a semiconductor circuit cause an increase in power consumption. The prevention of this increase has been an important request item in designing a semiconductor circuit. One example of measures to reduce power consumption is making a signal have a small amplitude. For example, a circuit that reduces an output amplitude of an output circuit by reducing a power supply voltage to be supplied to the output circuit by using a regulator circuit has been proposed (see, for example, Patent Document 1).

CITATION LIST

Patent Document

Patent Document 1: Japanese Patent No. 3927788

SUMMARY OF THE INVENTION

Problems to be Solved by the Invention

In the conventional technology described above, power can be reduced by reducing an output amplitude of a circuit. However, this requires a dedicated constant voltage supply circuit, and there is a possibility of an increase in the area of the circuit or an increase in voltage. Furthermore, a waveform of an output signal is reduced proportionally in a voltage direction, and this causes a problem in which a timing of the circuit is delayed in comparison with a circuit having a full amplitude.

The present technology has been developed in view of such circumstances, and it is an object of the present technology to cause a signal to have a small amplitude without increasing a voltage source, and reduce power consumption.

Solutions to Problems

The present technology has been developed in order to solve the problems described above. A first aspect of the present technology is a semiconductor circuit including: a driver that connects a first transistor and a second transistor; and a pulse control circuit that supplies a first control signal and a second control signal to the first transistor and the second transistor, and reduces an output amplitude of the driver, the first control signal and the second control signal being different in a pulse width from each other. This causes an effect of causing an output of the driver to have a small amplitude.

Furthermore, in this first aspect, each of the first control signal and the second control signal may include a signal indicating either a first state or a second state. The first transistor may connect a first potential and an output signal line, may enter into a disconnection state when the first control signal is in the first state, and may enter into a conductive state and may change the output signal line toward the first potential when the first control signal is in the second state. The second transistor may connect a second potential and the output signal line, may enter into the disconnection state when the second control signal is in the second state, and may enter into the conductive state and may change the output signal line toward the second potential when the second control signal is in the first state. The pulse control circuit may supply the first control signal that has had the pulse width adjusted to cause a period in the second state to be shorter than a period in the first state in the first control signal. This causes an effect of controlling the first transistor by using the first control signal having the adjusted pulse width, and causing an output of the driver to have a small amplitude.

Furthermore, in this first aspect, the pulse control circuit may include: a delay circuit that delays an input signal by a predetermined period, the input signal indicating either the first state or the second state; a NAND circuit that generates a NAND of an output of the delay circuit and the input signal, and outputs the NAND as the first control signal; and a logic inversion circuit that inverts a logic of the input signal, and outputs the input signal as the second control signal. This causes an effect of controlling the first transistor by using the first control signal having a pulse width that corresponds to a delay period of the delay circuit, and causing an output of the driver to have a small amplitude.

Furthermore, in this first aspect, the pulse control circuit may further include an input signal control circuit that invalidates the input signal to be supplied to the delay circuit in accordance with a predetermined control signal. This causes an effect of controlling an amplitude of an output of the driver according to the predetermined control signal.

Furthermore, in this first aspect, the pulse control circuit may further include a pulse width setting circuit that specifies the predetermined period of the delay circuit, and sets the pulse width. This causes an effect of controlling the first transistor by using the first control signal having the set pulse width, and causing an output of the driver to have a small amplitude.

Furthermore, in this first aspect, the pulse control circuit may further include a high-impedance compensation circuit that leads an output of the driver to the first potential or the second potential. This causes an effect of avoiding a high impedance of an output of the driver.

Furthermore, in this first aspect, a detection circuit that detects that the output amplitude of the driver has reached a predetermined potential may be further included. The pulse control circuit may determine the pulse width according to a timing at which it has been detected that the output amplitude of the driver has reached the predetermined potential. This causes an effect of determining the pulse width by using an output of the driver without setting the pulse width in advance.

Furthermore, in this first aspect, a second driver that connects a third transistor and a fourth transistor, and outputs a signal having an inverse polarity of a polarity of a signal of the driver may be further included. The pulse control circuit may supply a third control signal and a fourth control signal to the third transistor and the fourth transistor, and may reduce an output amplitude of the second driver, the third control signal and the fourth control signal being different in the pulse width from each other. This causes an effect of causing an output of a differential driver to have a small amplitude.

Furthermore, a second aspect of the present technology is a semiconductor circuit including: a reception circuit that is connected between a first potential and a second potential, and receives an input signal; and a diode that is connected between the reception circuit and the first potential, and lowers a voltage from the first potential. This causes an effect of a shift to an interruption state according to an input signal even if an input signal has a small amplitude.

Furthermore, the second aspect of the present technology may further include a supply transistor that is connected in parallel to the diode, and enters into a conductive state and supplies a current from the first potential to the reception circuit when the input signal indicates the second potential. This causes an effect of a shift to the conductive state according to an input signal even in a case where the diode is connected to the reception circuit.

Furthermore, in the second aspect of the present technology, the reception circuit may include an inverter that inverts the input signal.

Furthermore, the second aspect of the present technology may further include: a latch circuit that latches an output of the reception circuit; and an AND circuit that generates an AND of the output of the reception circuit and the latch circuit, and the input signal may include a clock signal. This causes an effect of causing an output of a clock enabler to have a small amplitude.

Furthermore, a third aspect of the present technology is a semiconductor system including a first semiconductor chip and a second semiconductor chip that are connected by a transmission line. The first semiconductor chip includes a driver that connects a first transistor and a second transistor, and outputs a signal to the transmission line, and a pulse control circuit that supplies a first control signal and a second control signal to the first transistor and the second transistor, and reduces an output amplitude of the driver, the first control signal and the second control signal being different in a pulse width from each other. The second semiconductor chip includes a reception circuit that receives a signal from the transmission line, and a diode that is connected between the reception circuit and a power supply, and lowers a voltage from the power supply. This causes an effect of causing a signal transmitted between chips to have a small amplitude.

MODES FOR CARRYING OUT THE INVENTION

Modes for carrying out the present technology (hereinafter referred to as "embodiments") are described below. Description is provided in the order described below.

1. First embodiment (example of pulse control small-amplitude driver)

2. Second embodiment (example of setting pulse width of pulse control small-amplitude driver)

3. Third embodiment (example of low-threshold reception circuit)

4. Fourth embodiment (example in which driving circuit of low-threshold reception circuit has been independently provided)

5. Fifth embodiment (example of application to clock enable circuit)

6. Sixth embodiment (example of output detection type pulse control small-amplitude driver)

7. Seventh embodiment (example of differential pulse control small-amplitude driver of differential input)

8. Eighth embodiment (first example of differential pulse control small-amplitude driver of single-phase input)

9. Ninth embodiment (second example of differential pulse control small-amplitude driver of single-phase input)

10. Tenth embodiment (example of differential output detection type pulse control small-amplitude driver)

11. Eleventh embodiment (example of application to semiconductor system)

1. First Embodiment

[Pulse Control Small-Amplitude Driver]

Figure 1:
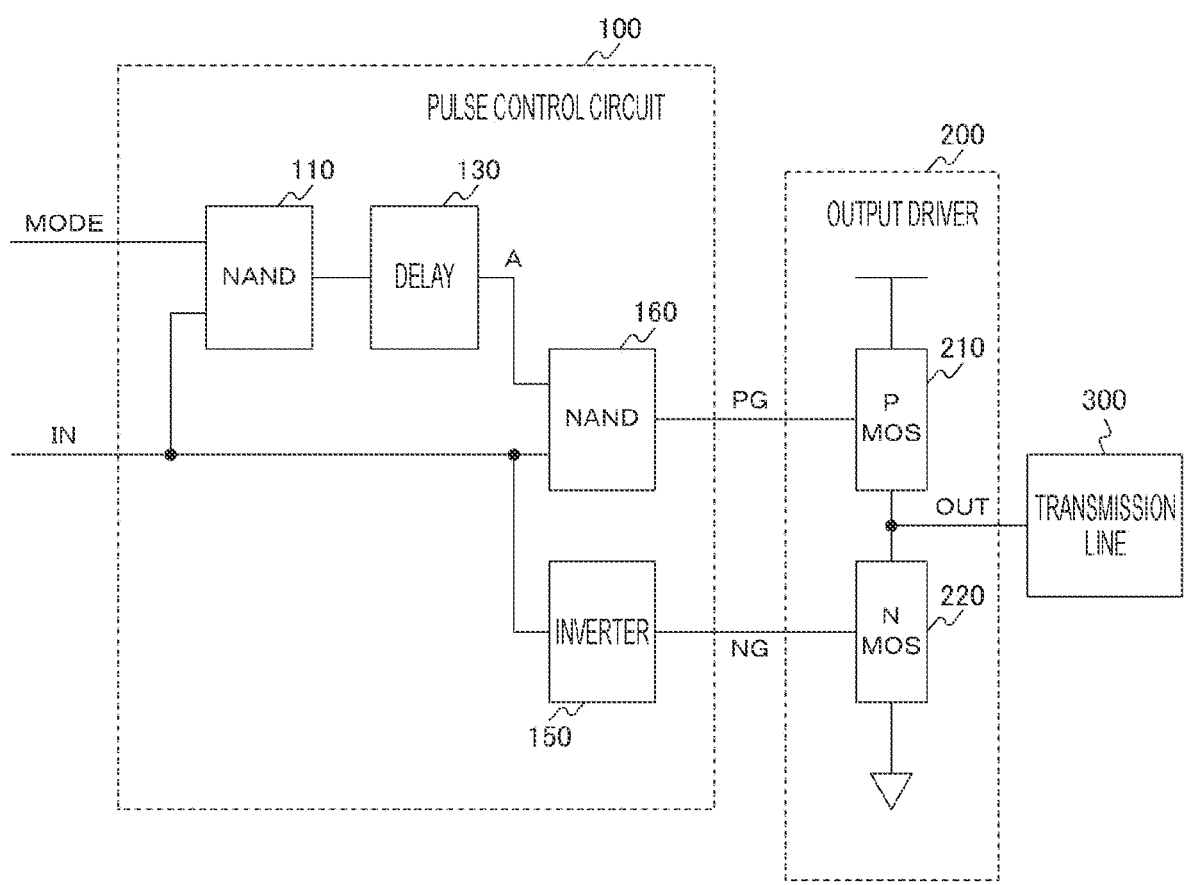
FIG. 1 is a diagram illustrating a configuration example of a pulse control small-amplitude driver according to a first embodiment of the present technology.

FIG. 1 is a diagram illustrating a configuration example of a pulse control small-amplitude driver according to a first embodiment of the present technology.

This pulse control small-amplitude driver includes an output driver 200 that includes a PMOS 210 and an NMOS 220. A signal of an output signal line of a connecting part of the PMOS 210 and the NMOS 220 is supplied to an output terminal OUT.

Furthermore, this pulse control small-amplitude driver includes a pulse control circuit 100. This pulse control circuit 100 supplies the output driver 200 with control signals PG and NG that control the output driver 200.

This pulse control circuit 100 includes an input terminal IN and a mode input terminal MODE. The input terminal IN is a terminal that receives an input signal. It is assumed that the input signal is a periodic signal that equally repeats an L-level and an H-level of, for example, a clock or the like. However, another data signal can also be applied. The mode input terminal MODE is a terminal that receives a mode signal indicating either a low-amplitude mode or a normal mode. It is assumed, for example, that the mode signal indicates the normal mode at the L-level, and indicates a small-amplitude mode at the H-level.

This pulse control circuit 100 includes NAND circuits 110 and 160, a delay circuit 130, and an inverter 150.

The NAND circuit 110 is a circuit that generates the NAND of an input signal that has been input to the input terminal IN and a mode signal that has been input to the mode input terminal MODE. Therefore, this NAND circuit 110 operates to output an input signal only in a case where the mode signal indicates the small-amplitude mode. Stated another way, in the normal mode, the input signal is not output to the NAND circuit 160, and is invalidated. Note that the NAND circuit 110 is an example of the input signal control circuit described in the claims.

The delay circuit 130 delays an output of the NAND circuit 110 by a predetermined period. Note that the delay circuit 130 is an example of the delay circuit described in the claims.

The NAND circuit 160 is a circuit that generates the NAND of an output of the delay circuit 130 and the input signal that has been input to the input terminal IN. An output of this NAND circuit 160 is supplied as a control signal PG to a gate of the PMOS 210. Note that the NAND circuit 160 is an example of the NAND circuit described in the claims.

The inverter 150 inverts a logic of the input signal that has been input to the input terminal IN. An output of this inverter 150 is supplied as a control signal NG to a gate of the NMOS 220. Note that the inverter 150 is an example of the second logic inversion circuit described in the claims.

The PMOS 210 connects a power supply potential VDD and an output signal line. This PMOS 210 enters into a disconnection state when the control signal PG is in the H-level. This PMOS 210 enters into a conductive state when the control signal PG is in the L-level, and raises the output signal line toward the power supply potential VDD. Note that the PMOS 210 is an example of the first transistor described in the claims.

The NMOS 220 connects a ground potential and the output signal line. This NMOS 220 enters into the disconnection state when the control signal NG is in the L-level. This NMOS 220 enters into the conductive state when the control signal NG is in the H-level, and lowers the output signal line toward the ground potential. Note that the NMOS 220 is an example of the second transistor described in the claims.

[Timing]

Figure 2:
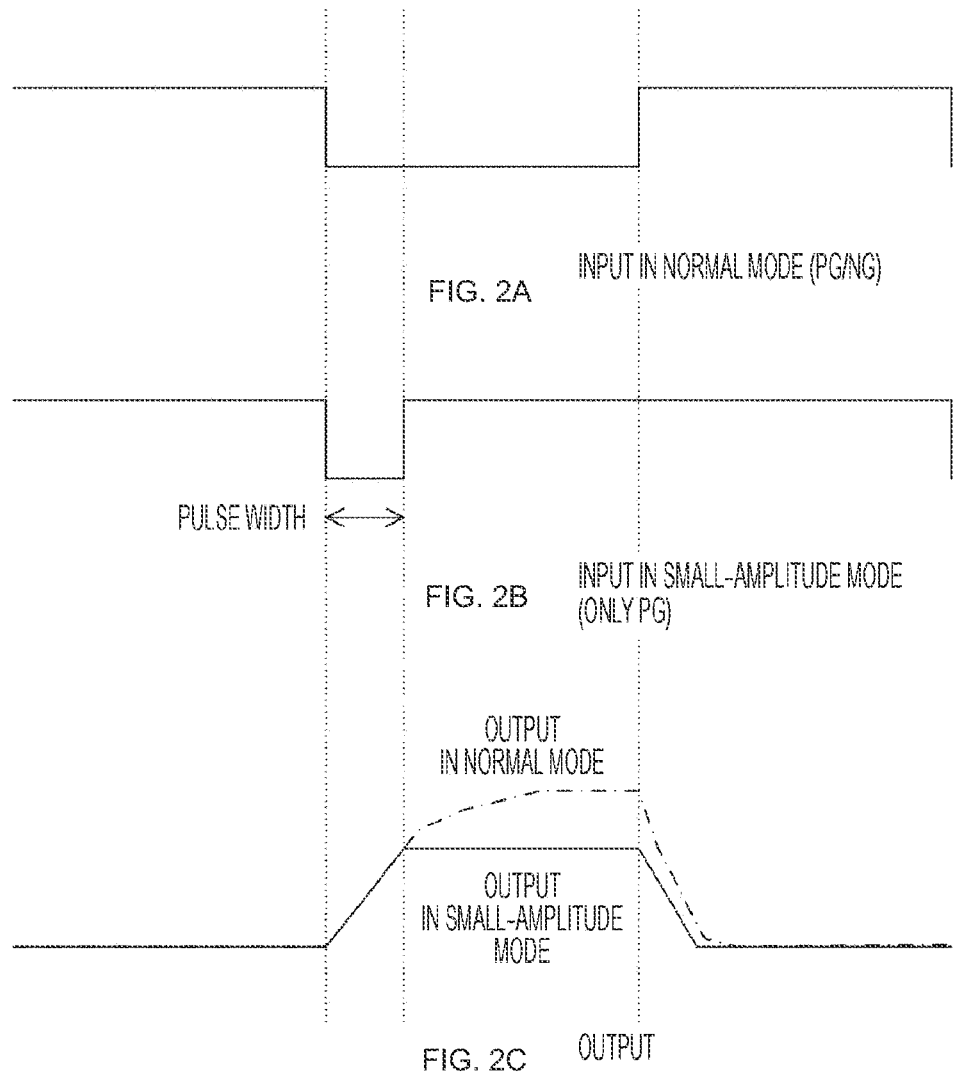
FIGS. 2A, 2B, and 2C are diagrams illustrating an example of an input/output waveform of the pulse control small-amplitude driver according to the first embodiment of the present technology.

FIGS. 2A, 2B, and 2C are diagrams illustrating an example of an input/output waveform of the pulse control small-amplitude driver according to the first embodiment of the present technology.

In the same drawing, FIG. 2A illustrates a waveform of the control signals PG and NG in the normal mode. In the normal mode, control signals having the same waveforms are supplied to the PMOS 210 and the NMOS 220. Therefore, an output signal having a large-amplitude waveform, as illustrated with an alternating long and short dashed line in c of the same drawing, is obtained in the output terminal OUT. The bluntness of the output signal results from an influence of a parasitic capacitance, and a signal level rises at a fixed time constant.

In the same drawing, FIG. 2B illustrates a waveform of the control signal PG in the small-amplitude mode. Note that the control signal NG has the same waveform as a waveform in the case of the normal mode. As described above, a signal level of an output signal rises at a fixed time constant due to an influence of a parasitic capacitance. However, in the small-amplitude mode, a pulse width of the control signal PG has been set to be small, and therefore a rise in the signal level can be stopped before the signal level has risen to the highest. Therefore, an output signal having a small-amplitude waveform, as illustrated with a solid line in FIG. 2C of the same drawing, is obtained in the output terminal OUT.

In this output signal in the small-amplitude mode, the gradients of rising and falling have a value that is equal to a value of a waveform having a full amplitude in the normal mode. In a case where an amplitude has been made small by reducing a power supply voltage, as described in the conventional technology, a rising time becomes longer, and a high-speed operation or a timing has constraints. In contrast, according to this embodiment, an increase in amplitude can be stopped at a time in point at which a pulse is stopped, and therefore a rising waveform having the same gradient as a gradient of a circuit having a normal amplitude can be output.

Figure 3:
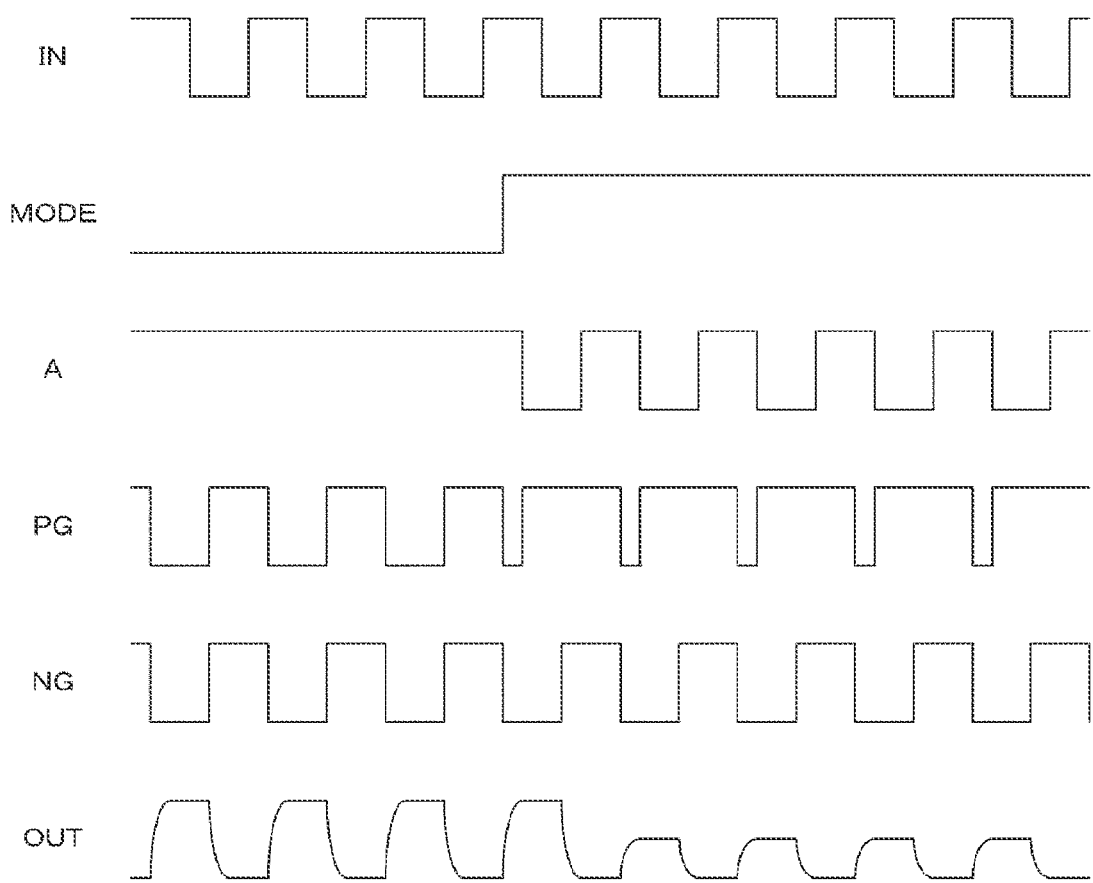
FIG. 3 is a diagram illustrating an operation timing example of the pulse control small-amplitude driver according to the first embodiment of the present technology.

FIG. 3 is a diagram illustrating an operation timing example of the pulse control small-amplitude driver according to the first embodiment of the present technology.

Here, a case is assumed where a periodic signal has been input as an input signal to the input terminal IN and a mode signal to be input to the mode input terminal MODE has been switched from the normal mode (the L-level) to the small-amplitude mode (the H-level). Note that a signal A is an output signal of the delay circuit 130.

In the normal mode, an output of the NAND circuit 110 has the L-level, and therefore an input signal is masked, and is not output to the signal A. In contrast, in the small-amplitude mode, the input signal is supplied to the delay circuit 130, and a periodic signal that has been delayed by a predetermined period is obtained as the signal A.

In the NAND circuit 160, the NAND of an output of the delay circuit 130 and the input signal that has been input to the input terminal IN is generated. Therefore, in the small-amplitude mode, a control signal PG having a pulse width that corresponds to a delay time in the delay circuit 130 is obtained. As a result, an output signal having a small-amplitude waveform is obtained in the output terminal OUT.

As described above, according to the first embodiment of the present technology, by reducing a width of a pulse that drives the PMOS 210 in the conductive state, an output amplitude of the output driver 200 can be made to be a small amplitude. This enables power consumption to be reduced.

Stated another way, simple control enables a small-amplitude output, and by reducing an amplitude of an output of the driver, a reduction in power consumption can be achieved while a high-speed operation is maintained, with little influence on a timing. Driving is performed by using a transistor having the same driving capability as a driving capability in the case of a normal amplitude. Therefore, a rising time of an output is equal until a desired amplitude is obtained, and a timing does not deteriorate. Furthermore, an operation frequency does not deteriorate. Variations in an output voltage are smaller than variations in a driver voltage or a process. In a case where a voltage of the driver is high, a pulse width decreases, and therefore an output amplitude decreases in comparison with the driver voltage. In a case where the voltage of the driver is low, the pulse width increases, and therefore the output amplitude increases in comparison with the driver voltage. As a result, a difference in voltage of the output voltage is small between the case of a high voltage and the case of a low voltage. In a case where a threshold at which a device is likely to operate at high speed is low, the pulse width decreases, and therefore the output amplitude decreases in comparison with the driver voltage. In a case where the voltage of the driver is low or in a case where a threshold at which the device is likely to operate at low speed is high, the pulse width increases, and therefore the output amplitude increases in comparison with the driver voltage. As a result, variations in the output voltage are smaller than variations in a process.

Furthermore, speeding-up can be achieved by using a small amount of power. The efficiency of data transfer and the energy efficiency of a circuit are improved. Then, power consumption can be reduced, and an energy cost of a mounted system can be reduced. Furthermore, a current value is reduced due to a reduction in the output amplitude, an element is prevented from deteriorating, and quality is improved.

2. Second Embodiment

[Pulse Control Small-Amplitude Driver]

Figure 4:
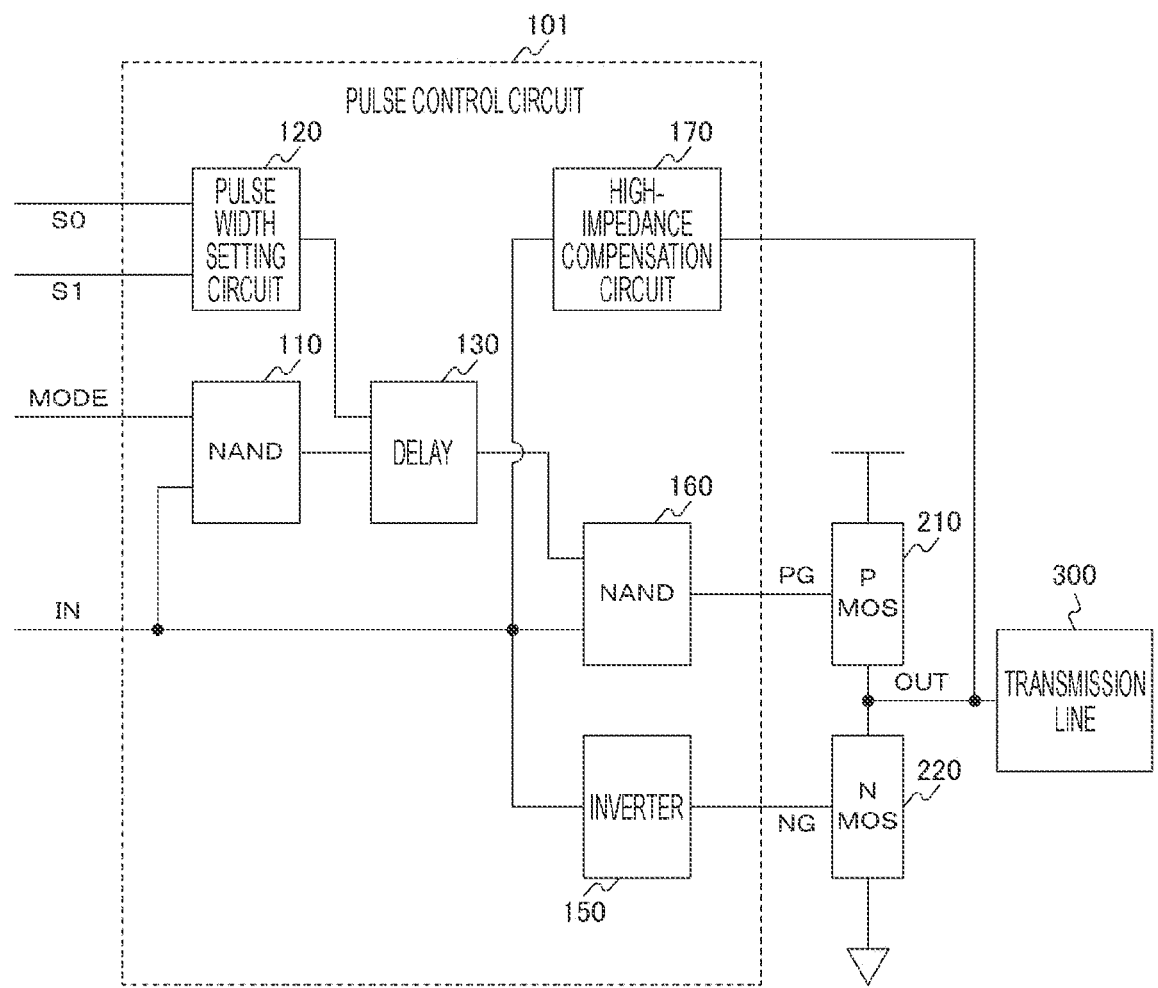
FIG. 4 is a diagram illustrating a configuration example of a pulse control small-amplitude driver according to a second embodiment of the present technology.

FIG. 4 is a diagram illustrating a configuration example of a pulse control small-amplitude driver according to a second embodiment of the present technology.

This pulse control small-amplitude driver according to the second embodiment is different from the pulse control small-amplitude driver according to the first embodiment in that a pulse width setting circuit 120 and a high-impedance compensation circuit 170 are further included.

The pulse width setting circuit 120 is a circuit that specifies a delay period of the delay circuit 130 and sets a pulse width of a control signal PG. Pulse width setting signals S0 and S1 are input to this pulse width setting circuit 120. The pulse width setting signals S0 and S1 specify the delay period in four stages by using two bits, and set the pulse width.

The high-impedance compensation circuit 170 is a circuit for avoiding the high impedance of the output driver 200. This high-impedance compensation circuit 170 includes two stages of inverters having a small driving capability, as described later. This high-impedance compensation circuit 170 is connected to the input terminal IN, and drives an output of the output driver 200 in accordance with an input signal. Therefore, the high-impedance compensation circuit 170 causes an output of the output driver 200 to enter into the L-level or the H-level.

However, this high-impedance compensation circuit 170 has a very small driving capability, and therefore a time period during which an output of the output driver 200 rises is very short in a desired frequency operation. Therefore, the output of the output driver 200 nearly stops rising at a voltage at a time when application of a pulse to the PMOS 210 stops, and a small-amplitude output operation is substantially achieved.

Figure 5:
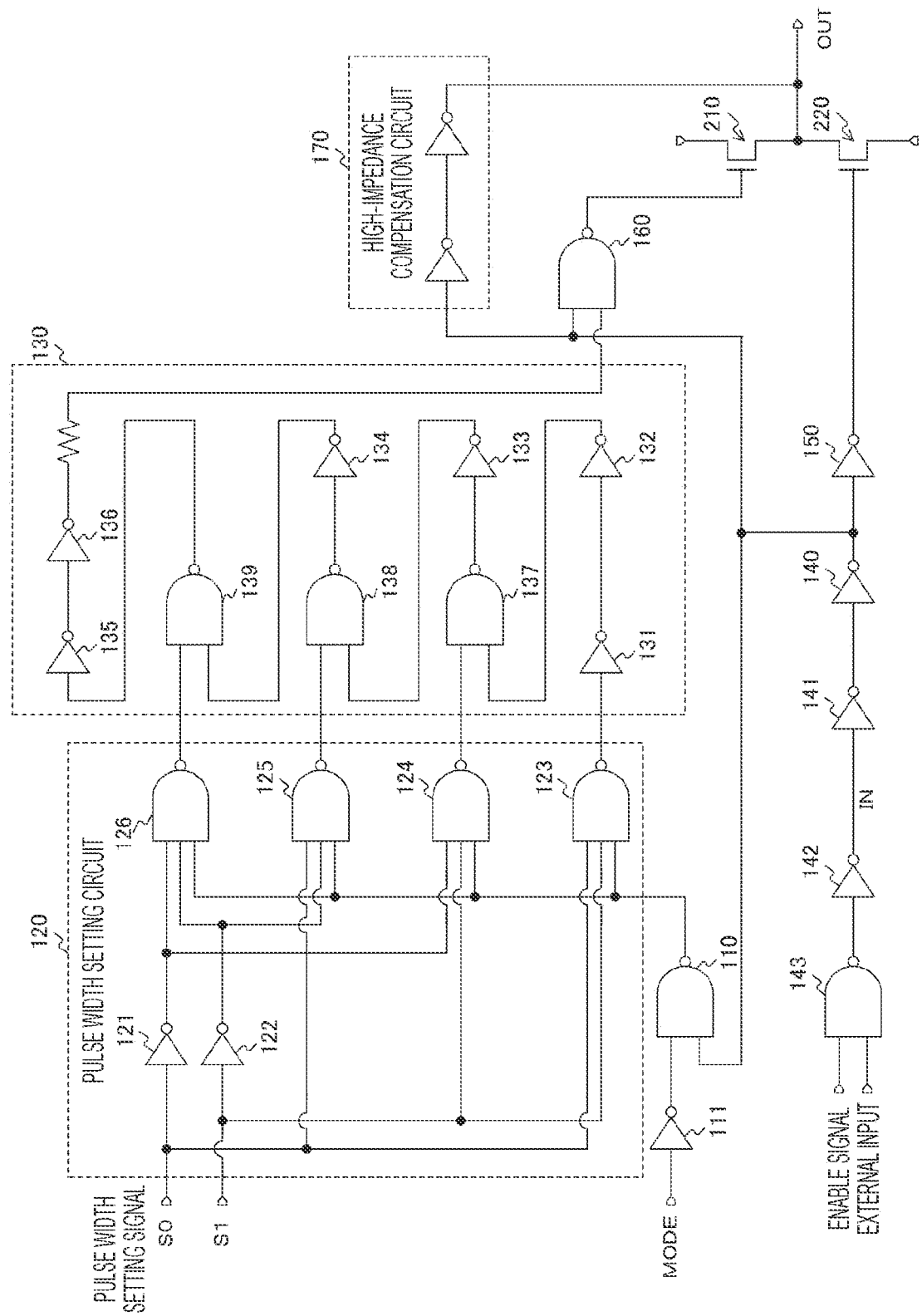
FIG. 5 is a diagram illustrating a circuit configuration example of the pulse control small-amplitude driver according to the second embodiment of the present technology.

FIG. 5 is a diagram illustrating a circuit configuration example of the pulse control small-amplitude driver according to the second embodiment of the present technology.

The pulse width setting circuit 120 is configured to decode the pulse width setting signals S0 and S1 of two bits and supply a 4-bit signal to the delay circuit 130 in a case where a mode signal indicates the small-amplitude mode. Stated another way, inverters 121 and 122 generate inverted signals of the pulse width setting signals S0 and S1, and NAND circuits 123 to 126 generate the NAND of a corresponding bit and the mode signal. Therefore, an input signal is only supplied to one pulse width specifying signal that corresponds to the pulse width setting signals S0 and S1.

The delay circuit 130 is configured to delay an input signal in accordance with the pulse width specifying signal that has been supplied from the pulse width setting circuit 120. Stated another way, inverters 131 to 136 are chain-connected, and NAND circuits 137 to 139 supply an input signal. Therefore, the input signal can be delayed by a delay period that corresponds to the pulse width setting signals S0 and S1.

The high-impedance compensation circuit 170 includes two stages of inverters that connect the input terminal IN and an output of the output driver 200 and have a small driving capability. Therefore, the high-impedance compensation circuit 170 drives the output of the output driver 200 in accordance with the input signal, and avoids a high impedance of the output driver 200.

[Waveform]

Figure 6:
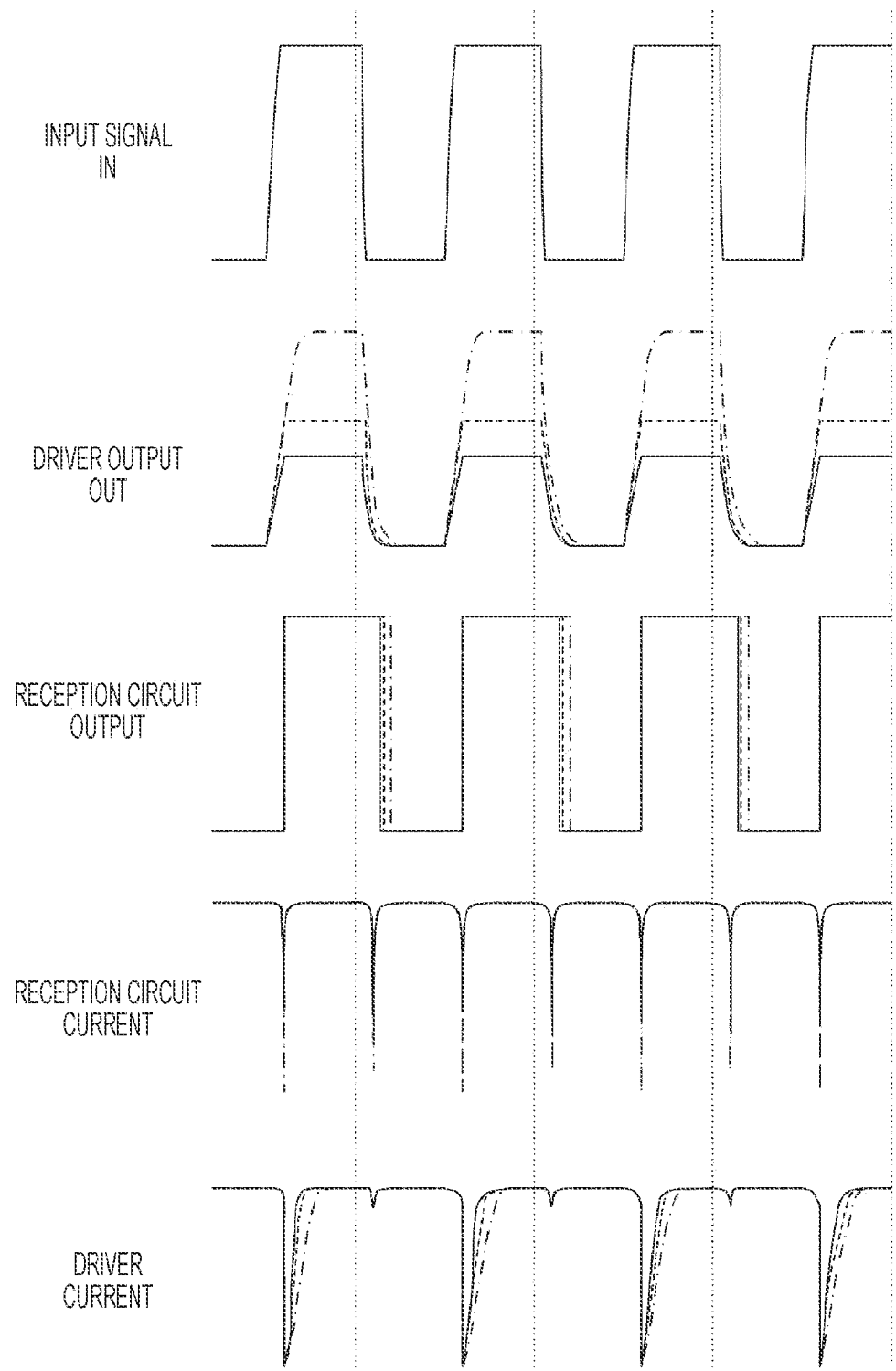
FIG. 6 is a diagram illustrating an example of an input/output waveform of the pulse control small-amplitude driver according to the second embodiment of the present technology.

FIG. 6 is a diagram illustrating an example of an input/output waveform of the pulse control small-amplitude driver according to the second embodiment of the present technology.

Referring to an output of the output driver 200 in a second portion that corresponds to an input signal in a first portion, it is apparent that an output amplitude can be easily changed by adjusting a pulse width. Here, it is indicated that, as the pulse width is reduced, the output amplitude decreases in the order of an alternating long and short dashed line, a dotted line, and a solid line according to a change in the pulse width.

Referring to an output and a current of a reception circuit in third and fourth portions, it is apparent that an influence on an output timing is small even if the output amplitude is changed.

Referring to a current of the output driver 200 in a fifth portion, it is apparent that the current decreases in accordance with a decrease in the output amplitude. Here, the area of a portion where a waveform has fallen indicates a magnitude of the current. The current and a voltage of the output of the output driver 200 decrease in accordance with a decrease in the pulse width.

As described above, according to the second embodiment of the present technology, by causing the pulse width setting circuit 120 to set a width of a pulse that drives the PMOS 210 in the conductive state, an output amplitude can be adjusted according to conditions as needed.

3. Third Embodiment

In the first and second embodiments described above, a small-amplitude driver that has a reduced output amplitude for power saving has been described. A low-threshold reception circuit (a small-amplitude level shift circuit) that receives, at a low threshold, a signal that has been output from the small-amplitude driver is described below.

[Low-Threshold Reception Circuit]

Figure 7:
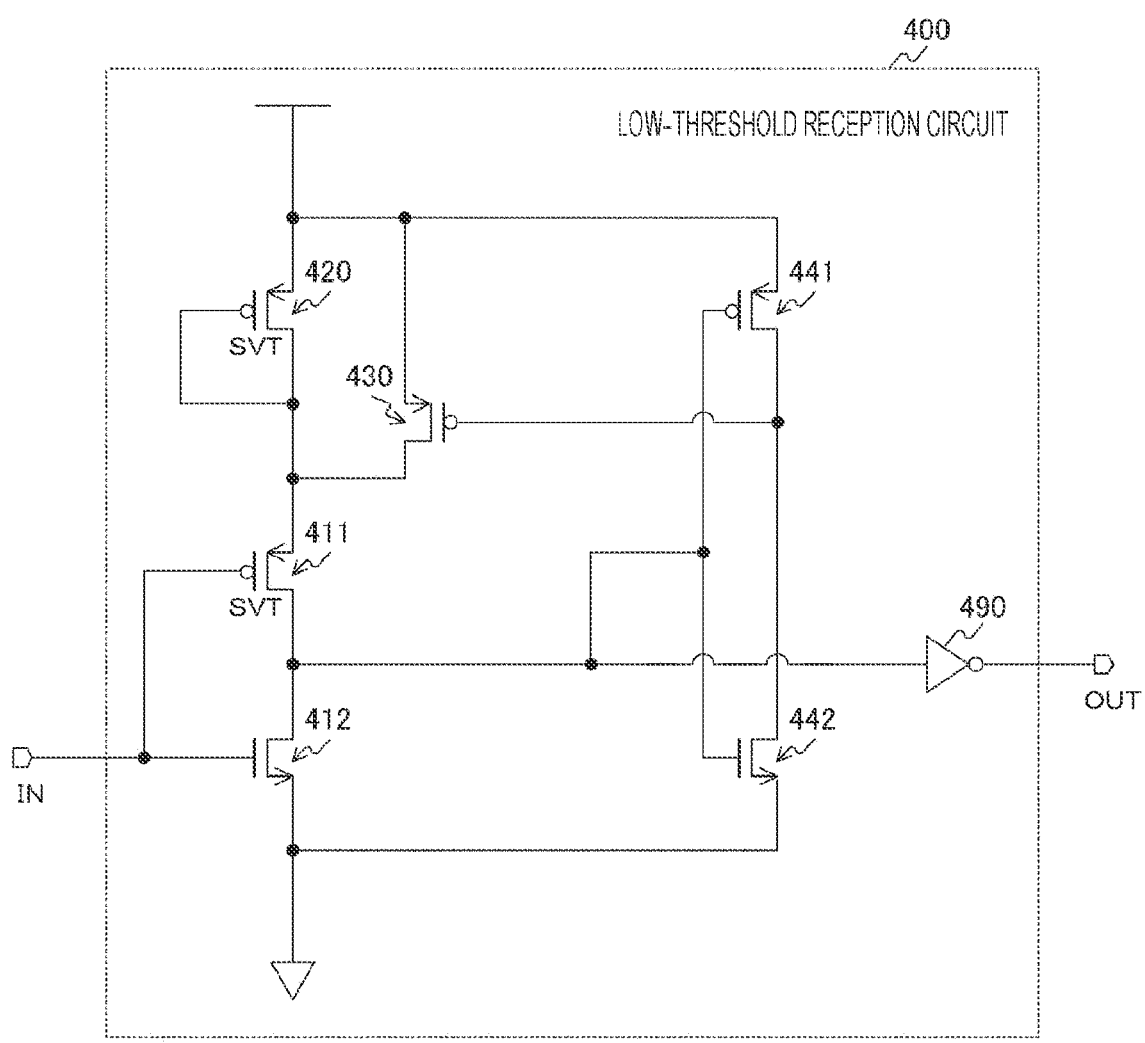
FIG. 7 is a diagram illustrating a circuit configuration example of a low-threshold reception circuit 400 according to a third embodiment of the present technology.

FIG. 7 is a diagram illustrating a circuit configuration example of a low-threshold reception circuit 400 according to a third embodiment of the present technology.

This low-threshold reception circuit 400 includes a PMOS 411 and an NMOS 412 that configure an input inverter, a MOS diode 420, a PMOS 430, a PMOS 441 and an NMOS 442 that configure a rear-stage inverter, and an output inverter 490. Note that the input inverter that includes the PMOS 411 and the NMOS 412 is an example of the reception circuit described in the claims.

As the PMOS 411 of the input inverter, a transistor (SVT) having a higher threshold is used in order to prevent a leak current from flowing at a small amplitude. The PMOS 411 shifts to an interruption state when an input signal of an input terminal IN is in the H-level. However, an amplitude of the input signal is small, and therefore the PMOS 411 does not completely enter into the interruption state in some cases. Therefore, the MOS diode 420 is connected between a source of the PMOS 411 and a power supply. This MOS diode 420 has a function of lowering a voltage from the power supply and preventing a current from flowing when the input signal is in the H-level. Note that this MOS diode 420 is also a transistor (SVT) having a higher threshold. This MOS diode 420 is an example of the diode described in the claims. Here, an example has been describer where a PMOS diode is used as the MOS diode 420 in order to prevent a current from flowing when the input signal is in the H-level. However, an NMOS diode may be used as this MOS diode 420.

On the other hand, when the input signal in the L-level, it is necessary to cause the PMOS 411 to enter into the conductive state and raise an output potential of the input inverter. However, the provision of the MOS diode 420 causes a current to be reduced, and the potential is not sufficiently raised in some cases. Therefore, the PMOS 430 is connected in parallel to the MOS diode 420. This PMOS 430 has a function of entering into the conductive state when the input signal is in the L-level, causing a current to flow from the power supply to the input inverter, and raising the output potential of the input inverter to the H-level. Therefore, the output inverter 490 obtains a sufficient driving capability. Note that the PMOS 430 is an example of the supply transistor described in the claims.

The rear-stage inverter (the PMOS 441 and the NMOS 442) is an inverter that inverts an output of the input inverter (the PMOS 411 and the NMOS 412) and supplies the inverted output to the PMOS 430. Stated another way, the PMOS 430 is supplied with a signal having the same logic as a logic of the input signal.

The output inverter 490 is an inverter that inverts an output of the input inverter and supplies the inverted output to a rear-stage circuit via an output terminal OUT. Stated another way, the output terminal OUT is supplied with a signal having the same logic as a logic of the input signal. Therefore, this low-threshold reception circuit 400 functions as a small-amplitude level shift circuit that converts a small-amplitude signal into a normal amplitude signal.

As described above, according to the third embodiment of the present technology, the MOS diode 420 and the PMOS 430 are connected in parallel on a power-supply side of the input inverter, and therefore a sufficient driving capability can be obtained for an input signal having a small amplitude, while a leak current is avoided.

Stated another way, a single-phase small-amplitude signal can be converted into a full-amplitude signal by using a single power supply. This enables a high-speed signal to be transmitted with low power. Furthermore, in a case where a conventional small-amplitude signal is converted into a full-amplitude signal, a conversion circuit does not require both a power supply for a small amplitude and a power supply for a full amplitude, and conversion can be handled by only using the power supply for the full amplitude. Furthermore, the number of power supplies and the number of signals are reduced. Therefore, wiring and power supply are reduced, and this enables a reduction in a cost. Furthermore, a small amplitude enables a reduction in a current. This prevents deterioration, and service life can be extended.

4. Fourth Embodiment

[Low-Threshold Reception Circuit]

Figure 8:
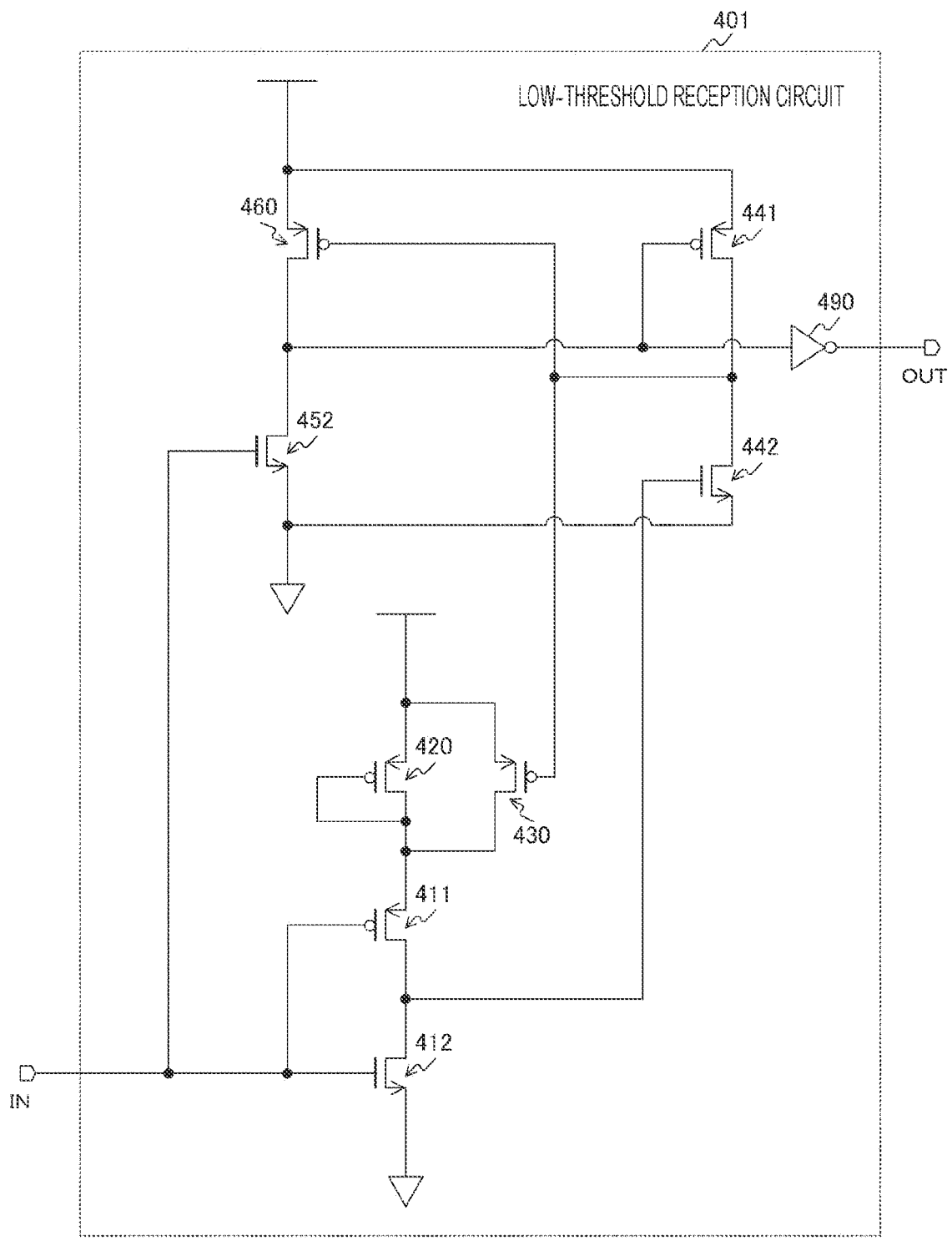
FIG. 8 is a diagram illustrating a circuit configuration example of a low-threshold reception circuit 401 according to a fourth embodiment of the present technology.

FIG. 8 is a diagram illustrating a circuit configuration example of a low-threshold reception circuit 401 according to a fourth embodiment of the present technology.

This low-threshold reception circuit 401 according to the fourth embodiment has a configuration in which a circuit that drives the output inverter 490 has been independently provided, in comparison with the low-threshold reception circuit 400 according to the third embodiment described above. Stated another way, a PMOS 460 that corresponds to the PMOS 430 and an NMOS 452 that corresponds to the NMOS 412 are added, and these drive the output inverter 490. Therefore, a leak current can be reduced, and a size of a transistor can be reduced.

As described above, according to the fourth embodiment of the present technology, a circuit that drives the output inverter 490 is independently provided, and this enables a size of a transistor to be reduced while a leak current is avoided.

5. Fifth Embodiment

[Clock Enable Circuit]

Figure 9:
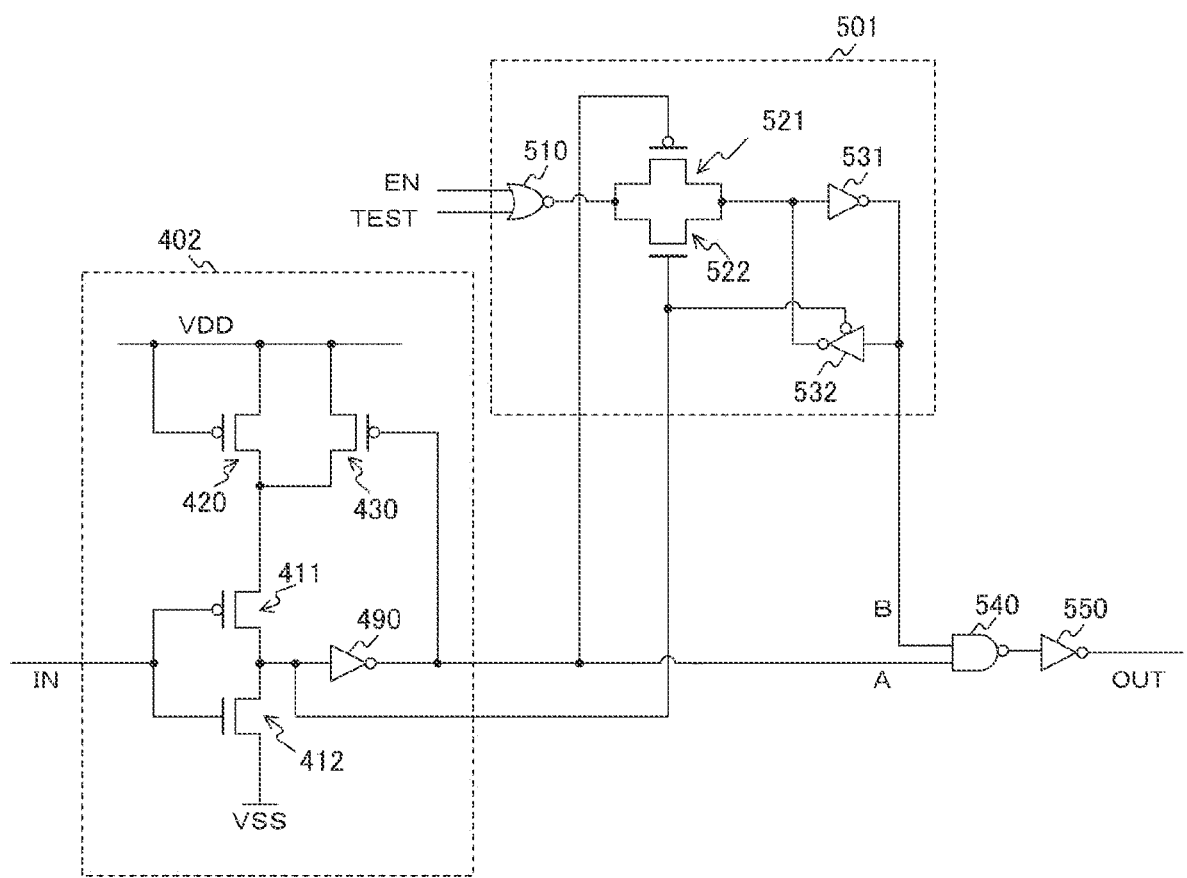
FIG. 9 is a diagram illustrating a circuit configuration example of a clock enable circuit according to a fifth embodiment of the present technology.

FIG. 9 is a diagram illustrating a circuit configuration example of a clock enable circuit according to a fifth embodiment of the present technology.

Here, an example in a case where a low-threshold reception circuit 402 that corresponds to the low-threshold reception circuit 400 according to the third embodiment described above has been incorporated into a clock enable circuit (an integrated clock gating cell) is described. This clock enable circuit includes the low-threshold reception circuit 402, a latch circuit 501, a NAND circuit 540, and an inverter 550.

The low-threshold reception circuit 402 is a low-threshold reception circuit that corresponds to the third embodiment described above. Here, it is assumed that a clock having a small amplitude is input to an input terminal IN. The clock having a small amplitude is amplified (level-shifted) by this low-threshold reception circuit 402 to be a clock having a normal amplitude.

The latch circuit 501 is driven by the clock that has been amplified by the low-threshold reception circuit 402, and latches a clock enable signal that has been input to an EN terminal or a test enable signal that has been input to a TEST terminal. This latch circuit 501 includes a NOR circuit 510, a PMOS 521, and an NMOS 522 that configure a clocked NOR, and inverters 531 and 532 that configure a clocked inverter.

The NAND circuit 540 generates the NAND of an output (a signal A) of the low-threshold reception circuit 402 and an output (a signal B) of the latch circuit 501. The inverter 550 inverts a logic of an output of the NAND circuit 540. Note that the NAND circuit 540 and the inverter 550 are an example of the AND circuit described in the claims.

[Timing]

Figure 10:
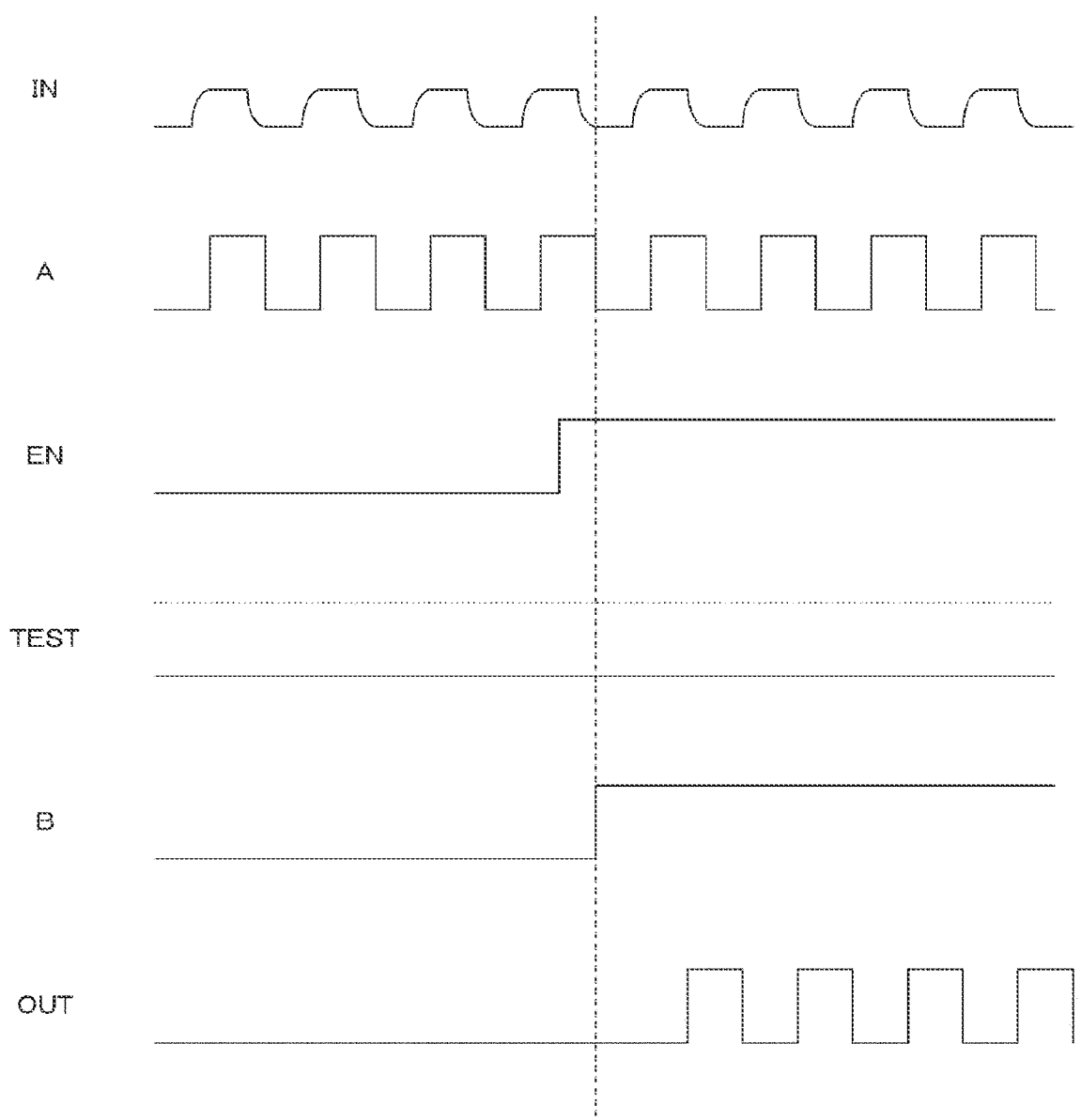
FIG. 10 is a diagram illustrating an example of an input/output waveform of the clock enable circuit according to the fifth embodiment of the present technology.

FIG. 10 is a diagram illustrating an example of an input/output waveform of the clock enable circuit according to the fifth embodiment of the present technology. Here, an example in which the TEST terminal is fixed to the L-level is described. An operation of the TEST terminal is equivalent to an operation of the EN terminal, and description is omitted here.

When a clock having a small amplitude is input to the input terminal IN, a clock signal having a normal amplitude is output as the output (the signal A) of the low-threshold reception circuit 402. While the EN terminal has the L-level, the latch circuit 501 latches a signal having the H-level, and therefore a signal having the L-level is output as the output (the signal B) of the latch circuit 501.

Thereafter, when the EN terminal changes to the H-level, the signal B shifts to the H-level at a falling timing of the next clock. Therefore, the NAND circuit 540 transmits an output of the low-threshold reception circuit 402, and a clock is supplied to an output terminal OUT.

As described above, according to the fifth embodiment of the present technology, the low-threshold reception circuit 402 is provided in a clock input of a clock enable circuit, and therefore enable control can be performed on a clock in synchronization with the clock while a small-amplitude clock signal is amplified.

Note that, in this fifth embodiment, the small-amplitude amplification circuit 402 that corresponds to the third embodiment has been used, but a small-amplitude amplification circuit that corresponds to the fourth embodiment may be used. Furthermore, for a purpose that can allow an increase in a leak current to a certain extent or in a case where a low-voltage power supply can also be supplied on a reception side, another small-amplitude amplification circuit in a conventional technology may be used.

6. Sixth Embodiment

[Output Detection Type Pulse Control Small-Amplitude Driver]

In the first and second embodiments described above, a pulse width of a control signal PG has been set in advance. However, in this sixth embodiment, a pulse width is generated by monitoring and detecting an actual output amplitude.

Figure 11:
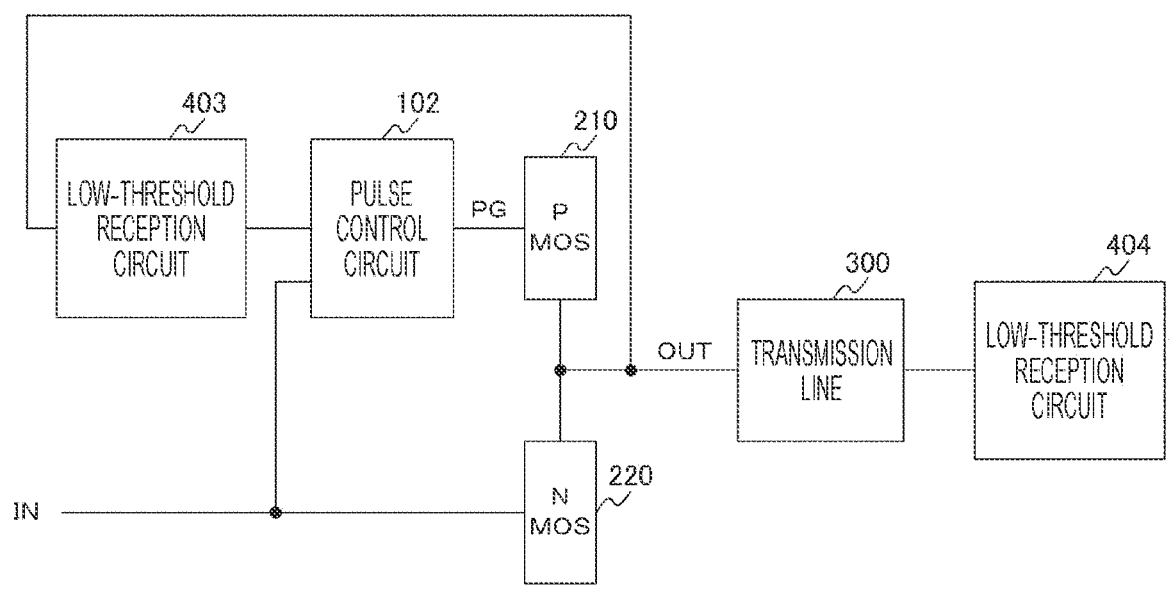
FIG. 11 is a diagram illustrating a configuration example of an output detection type pulse control small-amplitude driver according to a sixth embodiment of the present technology.

FIG. 11 is a diagram illustrating a configuration example of an output detection type pulse control small-amplitude driver according to the sixth embodiment of the present technology.

This output detection type pulse control small-amplitude driver includes a low-threshold reception circuit 403, a pulse control circuit 102, and a PMOS 210 and an NMOS 220 that configure an output buffer. An output terminal OUT of the output buffer is connected to a transmission line 300, and another end of the transmission line 300 is connected to a low-threshold reception circuit 404 on a reception side.

The low-threshold reception circuit 403 is a reception circuit that is equivalent to the low-threshold reception circuit 404 on the reception side. This low-threshold reception circuit 403 monitors a level of an output of the output buffer, and stops the driving of the control signal PG when it has been detected that the level has reached a level of a low threshold. Therefore, a pulse width of the control signal PG is determined. Note that the low-threshold reception circuit 403 is an example of the detection circuit described in the claims.

The pulse control circuit 102 supplies the control signal PG to the PMOS 210 in accordance with an output of the low-threshold reception circuit 403. This pulse control circuit 102 includes, for example, a NAND circuit.

[Timing]

Figure 12:
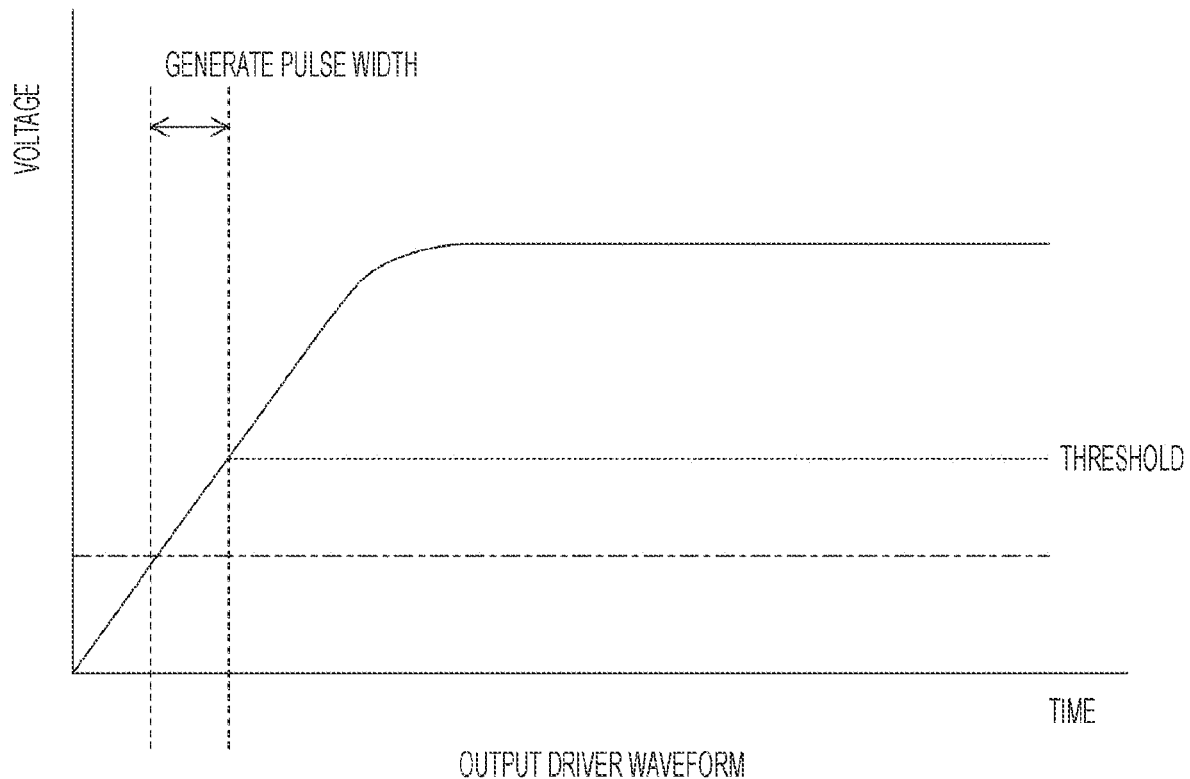
FIG. 12 is a diagram illustrating an example of an output waveform of an output buffer according to the sixth embodiment of the present technology.

FIG. 12 is a diagram illustrating an example of an output waveform of the output buffer according to the sixth embodiment of the present technology.

In an output waveform of the output buffer, a signal level rises at a fixed time constant due to an influence of a parasitic capacitance, as described above. In this sixth embodiment, the low-threshold reception circuit 403 that is equivalent to the low-threshold reception circuit 404 on the reception side monitors a level of an output of the output buffer. Then, when it has been detected that the level has reached a level of a low threshold, the low-threshold reception circuit 403 stops the driving of the control signal PG. Stated another way, a pulse width of the control signal PG is determined at this timing.

Note that, in this example, the low-threshold reception circuit 403 has been used similarly to the reception side, but the present technology can also be applied to a normal threshold. Stated another way, in a case where the output of the output buffer has a normal amplitude and a reception circuit having a normal threshold is used on the reception side, the reception circuit having a normal threshold is also used as a reception circuit to be provided on a driver side. Therefore, a pulse width can be determined according to a threshold that matches a threshold on the reception side.

Specific Example

Figure 13:
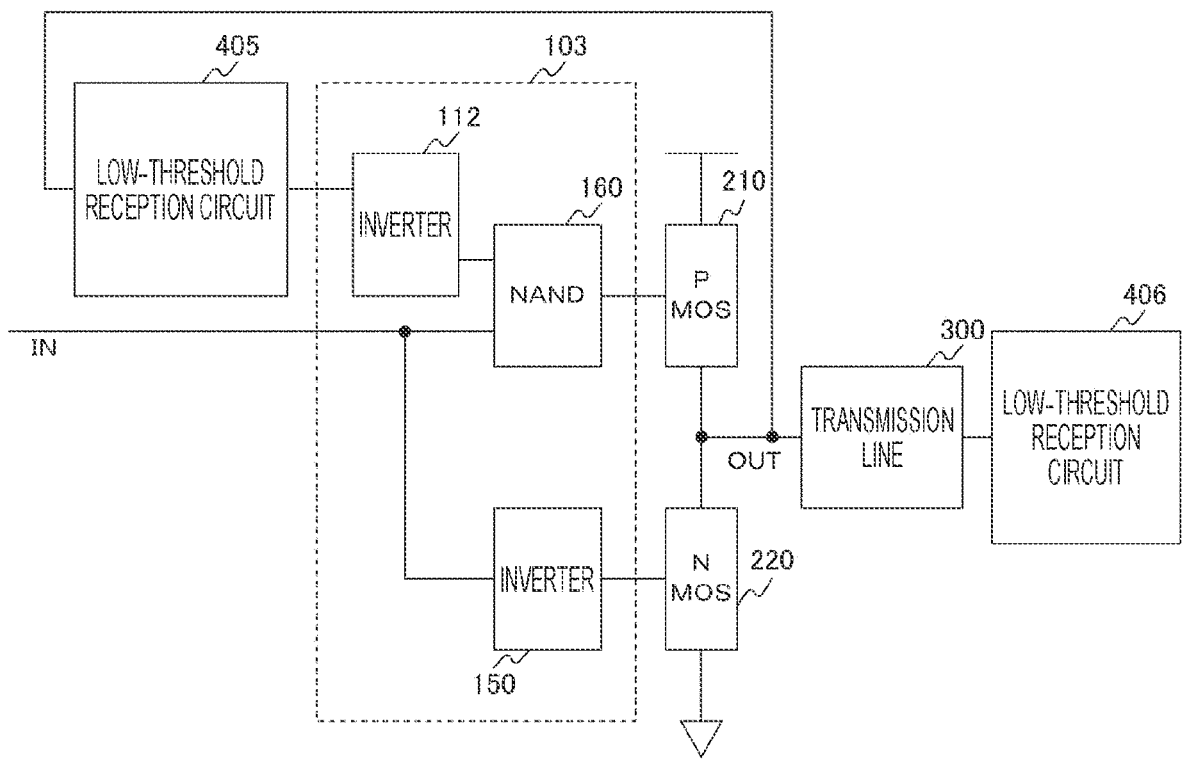
FIG. 13 is a diagram illustrating a specific configuration example of the output detection type pulse control small-amplitude driver according to the sixth embodiment of the present technology.

FIG. 13 is a diagram illustrating a specific configuration example of the output detection type pulse control small-amplitude driver according to the sixth embodiment of the present technology.

This output detection type pulse control small-amplitude driver includes a low-threshold reception circuit 405, a pulse control circuit 103, and a PMOS 210 and an NMOS 220 that configure an output buffer. An output terminal OUT of the output buffer is connected to a transmission line 300, and another end of the transmission line 300 is connected to a low-threshold reception circuit 406 on a reception side.

The pulse control circuit 103 includes inverters 112 and 150, and a NAND circuit 160. The inverter 112 inverts a logic of a signal that has been supplied from the low-threshold reception circuit 405. The inverter 150 inverts a logic of an input signal that has been input to an input terminal IN. An output of this inverter 150 is supplied as a control signal NG to a gate of the NMOS 220. The NAND circuit 160 is a circuit that generates the NAND of an output of the inverter 112 and an output of the inverter 150. An output of this NAND circuit 160 is supplied as a control signal PG to a gate of the PMOS 210.

The low-threshold reception circuit 405 is a reception circuit that is equivalent to the low-threshold reception circuit 406 on the reception side. This low-threshold reception circuit 405 monitors a level of an output of the output buffer, and stops the driving of the control signal PG when it has been detected that the level has reached a level of a low threshold. Therefore, a pulse width of the control signal PG is determined. The low-threshold reception circuit that has been described in the third or fourth embodiment described above can be used as these low-threshold reception circuits 405 and 406. Note that another reception circuit in a conventional technology may be used in a case where an increase in a leak current has an allowable level on the reception side or in a case where a low-voltage power supply line is distributed, for example.

As described above, according to the sixth embodiment of the present technology, a reception circuit that is equivalent to a reception circuit on a reception side detects a level of an output of an output buffer, and therefore a pulse width of a control signal PG can be determined.

Stated another way, the same circuit as a circuit on the reception side detects an output having a small amplitude, and a control pulse width is determined. Therefore, an output amplitude is determined to an appropriate voltage, and power consumption can be optimized. Furthermore, an output having a small amplitude is detected, and the control pulse width is determined. Therefore, it is not necessary to consider an output load and a pulse width at the time of designing, and the efficiency of designing can be improved. Furthermore, in addition to a reduction in a design cost due to improvements in the efficiency of designing, a circuit constant is automatically determined to an optimum value. Therefore, the scale of a circuit also has an optimum value, area efficiency increases, and a chip cost can also be reduced. Moreover, an optimum output amplitude is obtained. Therefore, a useless voltage margin is not needed, and this avoids, for example, a deterioration of an element, and quality can be improved.

7. Seventh Embodiment

In the first and second embodiments described above, a single-phase small-amplitude driver has been described. However, the present technology can also be applied to a differential driver. A differential pulse control small-amplitude driver is described below.

[Differential Pulse Control Small-Amplitude Driver]

Figure 14:
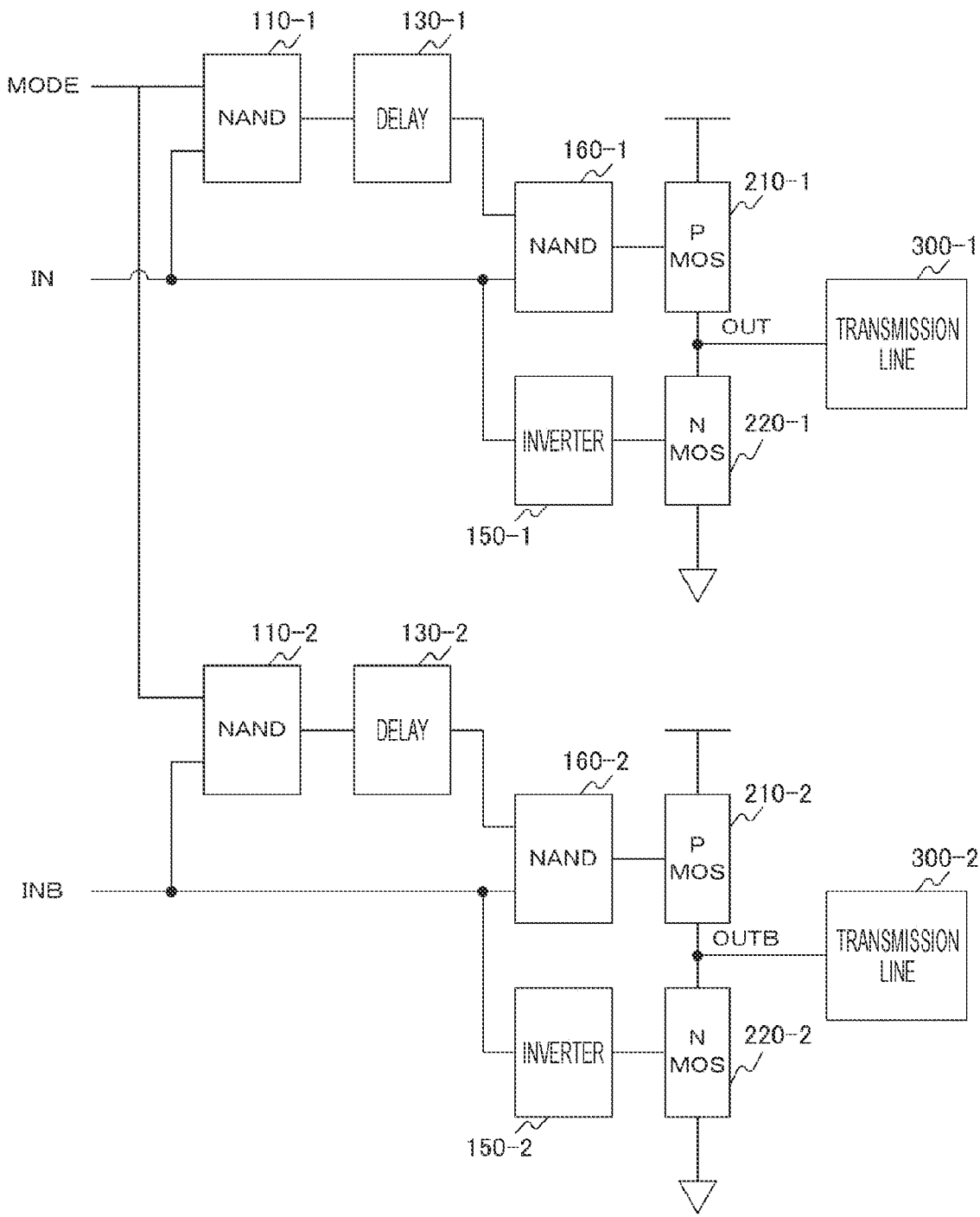
FIG. 14 is a diagram illustrating a configuration example of a differential pulse control small-amplitude driver according to a seventh embodiment of the present technology.

FIG. 14 is a diagram illustrating a configuration example of a differential pulse control small-amplitude driver according to a seventh embodiment of the present technology.

In this differential pulse control small-amplitude driver according to the seventh embodiment, a differential input of an input terminal IN and an input terminal INB to which an inverted signal of the input terminal IN is input is assumed. Then, two single-phase pulse control small-amplitude drivers are disposed in parallel, and a differential signal is output.

A circuit configuration that corresponds to the input terminal IN is similar to a circuit configuration according to the first embodiment described above. An output of an output buffer that includes a PMOS 210-1 and an NMOS 220-1 is output to a transmission line 300-1 via an output terminal OUT.

Furthermore, a circuit configuration that corresponds to the input terminal INB is basically similar to a circuit configuration according to the first embodiment described above, excluding the inversion of a polarity of a signal. An output of an output buffer that includes a PMOS 210-2 and an NMOS 220-2 is output to a transmission line 300-2 via an output terminal OUTB. Note that the PMOS 210-2 is an example of the third transistor described in the claims. Furthermore, the NMOS 220-2 is an example of the fourth transistor described in the claims.

In this configuration according to the seventh embodiment, a differential small-amplitude signal is distributed. Therefore, a differential level shift circuit in a conventional technology can be used as a reception circuit. Therefore, the level shift efficiency of the reception circuit can be improved, and a level of a small amplitude can be achieved even at a lower voltage. Furthermore, a signal level detection point of the reception circuit is a crossing point of a differential signal. Therefore, a voltage is low, and even if power supply noise of the reception circuit, or the like is generated, an influence on a timing can be reduced. These effects can prevent an increase in area or power due to an output circuit obtained by making an output circuit differential or the disposing of two transmission lines. Note that, needless to say, a reception circuit can perform reception in each single phase.

As described above, according to the seventh embodiment of the present technology, two single-phase pulse control small-amplitude drivers are disposed in parallel, and therefore a differential small-amplitude signal can be output.

Stated another way, a differential small-amplitude signal is distributed. Therefore, a conventional differential level shift circuit can be used as a reception circuit. Therefore, a signal level detection point of the reception circuit is a crossing point of a differential signal. Thus, a voltage is low, an influence on a timing can be reduced even if power supply noise of the reception circuit, or the like is generated, and speeding-up can be achieved. Furthermore, this enables improvements in the level shift efficiency of the reception circuit, a level of a small amplitude can be achieved even at a lower voltage, and power can be further reduced. These effects can prevent an increase in area or power due to an output circuit obtained by making an output circuit differential or the disposing of two transmission lines. Then, a signal level detection point of the reception circuit is a crossing point of a differential signal. Thus, a voltage is low, an influence on a timing can be reduced even if power supply noise of the reception circuit, or the like is generated, noise resistance is improved, and quality can be improved. Furthermore, a differential operation causes a current to flow bidirectionally, and therefore an element can be prevented from deteriorating.

8. Eighth Embodiment

[Differential Pulse Control Small-Amplitude Driver]

Figure 15:
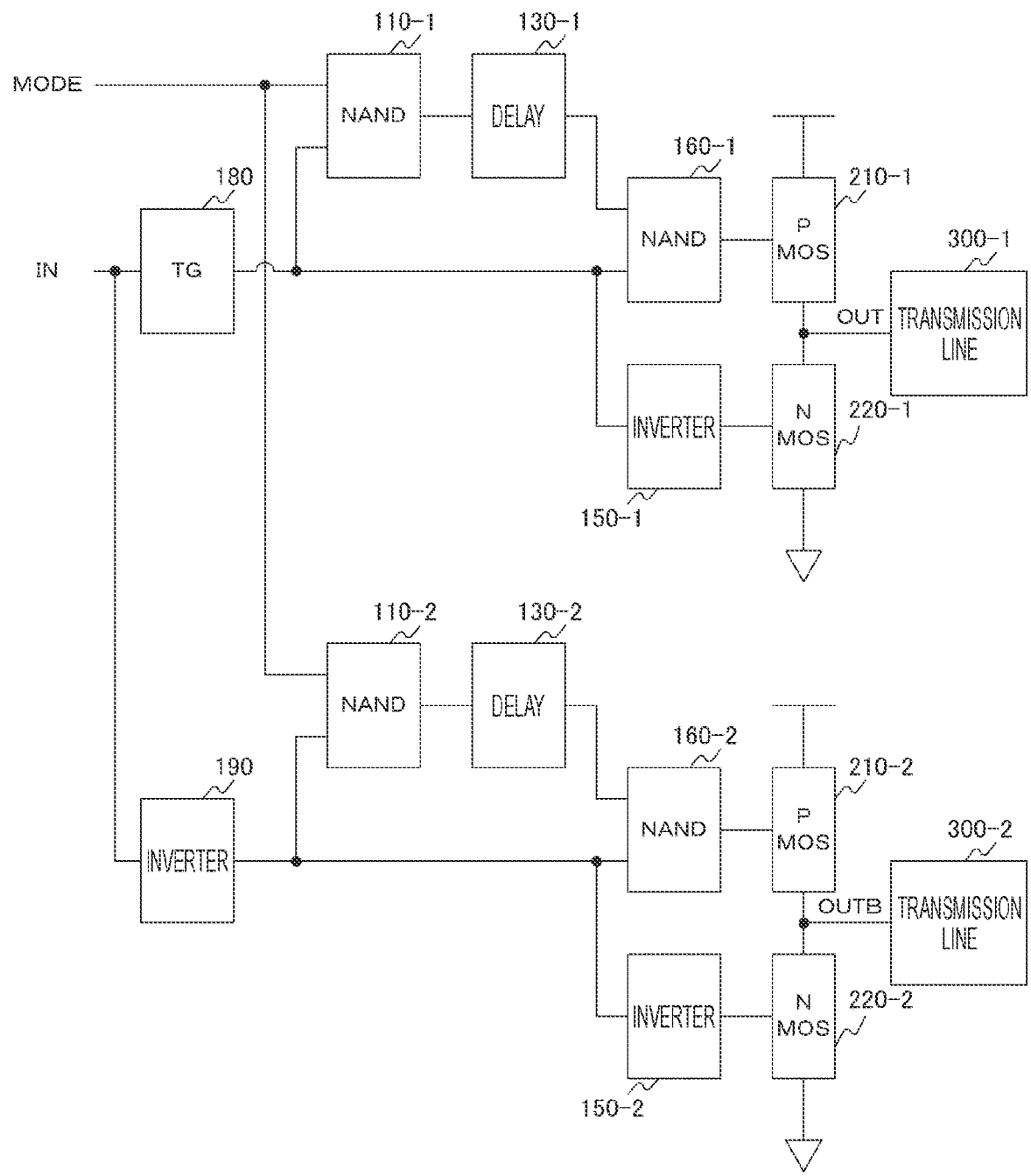
FIG. 15 is a diagram illustrating a configuration example of a differential pulse control small-amplitude driver according to an eighth embodiment of the present technology.

FIG. 15 is a diagram illustrating a configuration example of a differential pulse control small-amplitude driver according to an eighth embodiment of the present technology.

In this differential pulse control small-amplitude driver according to the eighth embodiment, a single-phase input of an input terminal IN is assumed. An input signal of the input terminal IN is distributed as a differential signal by a transfer gate (TG) 180 and an inverter 190. A configuration that follows is similar to a configuration according to the seventh embodiment described above.

As described above, according to the eighth embodiment of the present technology, the transfer gate (TG) 180 and the inverter 190 can distribute a single-phase signal as a differential signal. Therefore, even if a clock source has a single phase, an effect of differential clock distribution can be obtained.

9. Ninth Embodiment

[Differential Pulse Control Small-Amplitude Driver]

Figure 16:
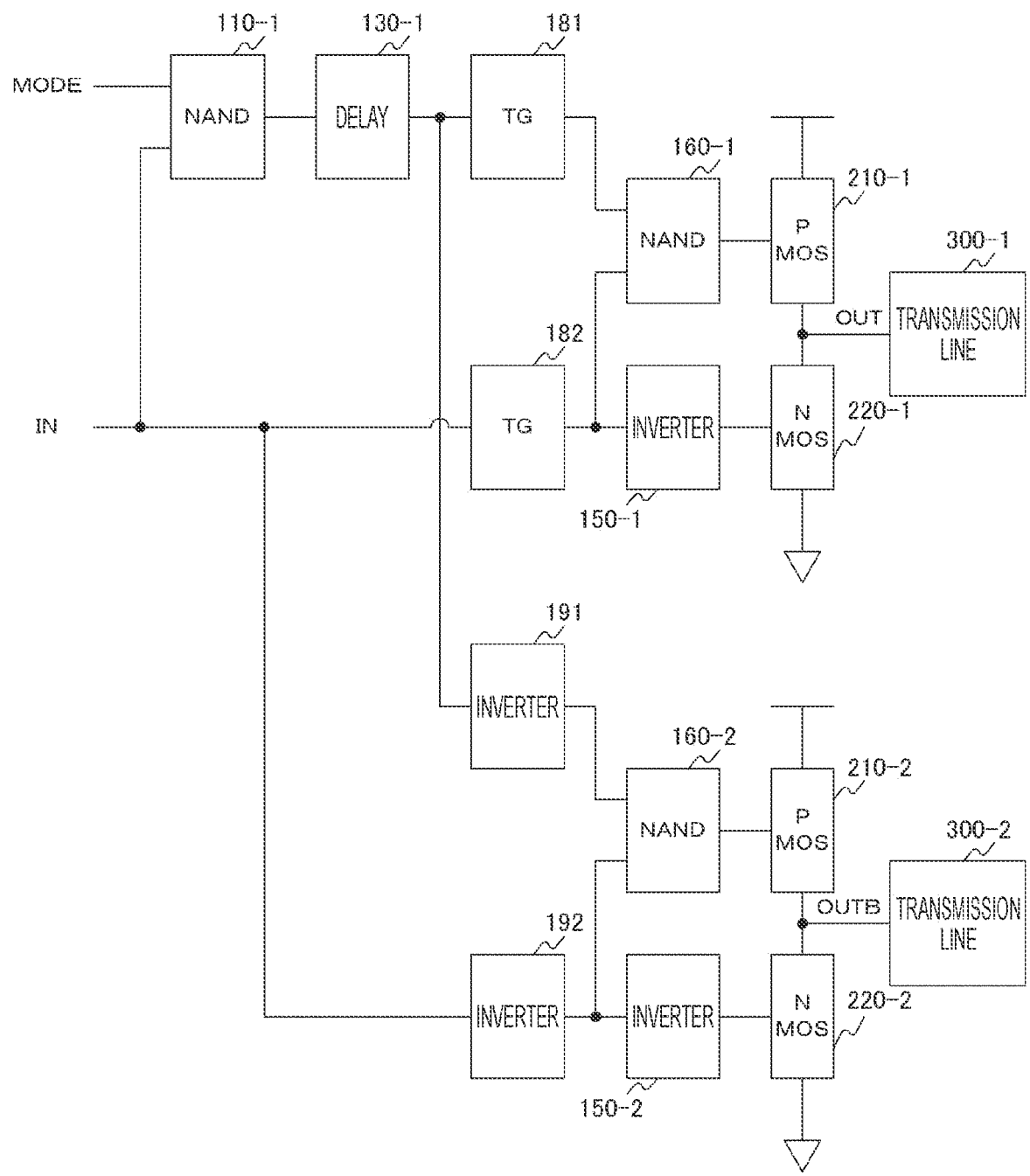
FIG. 16 is a diagram illustrating a configuration example of a differential pulse control small-amplitude driver according to a ninth embodiment of the present technology.

FIG. 16 is a diagram illustrating a configuration example of a differential pulse control small-amplitude driver according to a ninth embodiment of the present technology.

In the eighth embodiment described above, a single-phase signal of the input terminal IN has been converted into a differential signal in a first stage. However, in this ninth embodiment, this conversion function is disposed closer to an output driver. Therefore, a circuit that forms a pulse width is shared by differential circuits, and a reduction in area and a reduction in power can be achieved in a circuit.

Stated another way, an output of a delay circuit 130-1 is connected to a transfer gate (TG) 181 and an inverter 191. Thus, the delay circuit 130-1 is shared by differential circuits, and therefore the delay circuit 130-2 according to the eighth embodiment described above is not needed. On the other hand, an input terminal IN is connected to a transfer gate (TG) 182 and an inverter 192.

As described above, according to the ninth embodiment of the present technology, a circuit that forms a pulse width is shared by differential circuits, and this enables a reduction in area and a reduction in power in a circuit.

10. Tenth Embodiment

[Differential Output Detection Type Pulse Control Small-Amplitude Driver]

Figure 17:
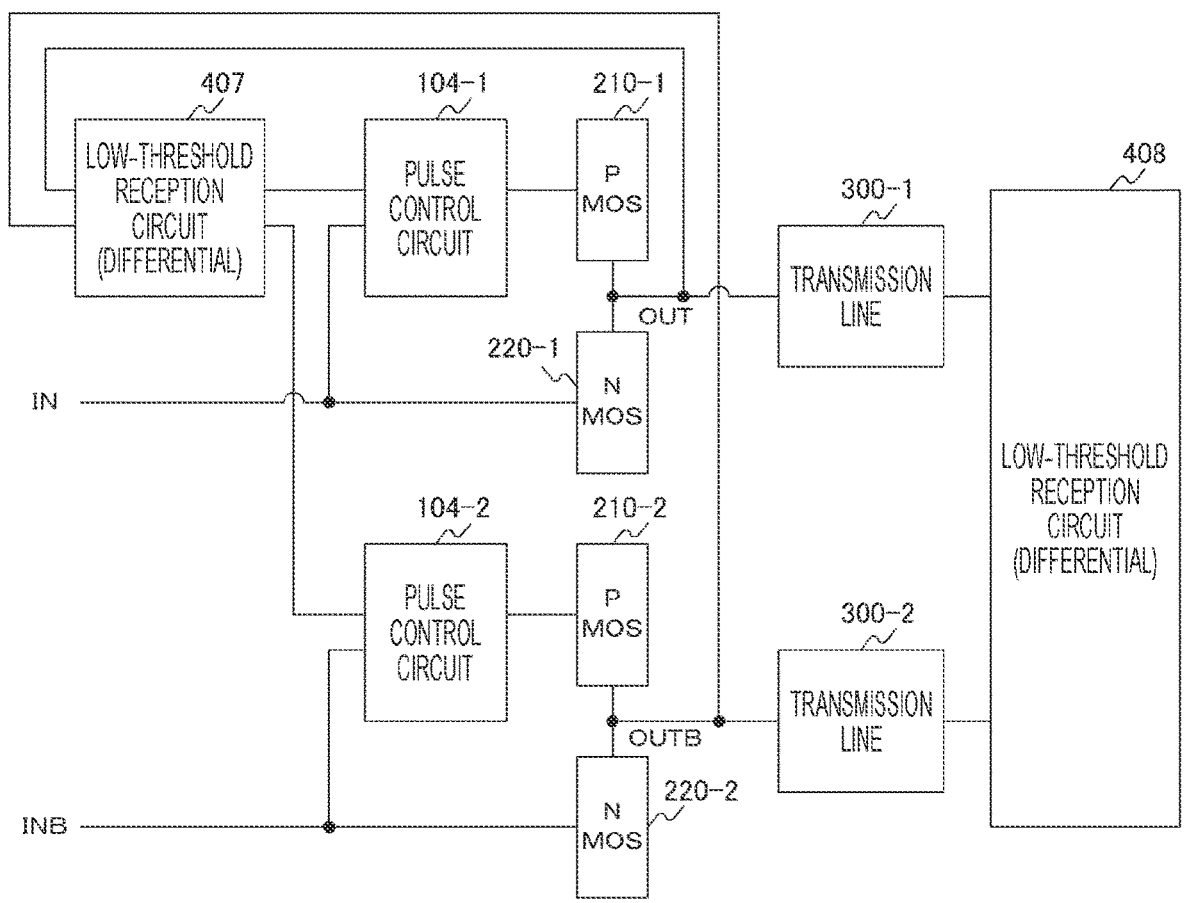
FIG. 17 is a diagram illustrating a configuration example of a differential output detection type pulse control small-amplitude driver according to a tenth embodiment of the present technology.

FIG. 17 is a diagram illustrating a configuration example of a differential output detection type pulse control small-amplitude driver according to a tenth embodiment of the present technology.

This differential output detection type pulse control small-amplitude driver according to the tenth embodiment is obtained by making the single-phase small-amplitude driver having an output amplitude detection function according to the sixth embodiment described above have a differential configuration. Therefore, a differential input of an input terminal IN and an input terminal INB to which an inverted signal of the input terminal IN is input is assumed, two single-phase pulse control small-amplitude drivers are disposed in parallel, and a differential signal is output.

Output terminals OUT and OUTB of an output buffer are connected to transmission lines 300-1 and 300-2, and other ends of the transmission lines 300-1 and 300-2 are connected to a low-threshold reception circuit 408 on a reception side. This low-threshold reception circuit 408 is a differential low-threshold reception circuit that receives a differential signal and operates. Accordingly, a low-threshold reception circuit 407 that is a reception circuit that is equivalent to the low-threshold reception circuit 408 on the reception side is also a differential low-threshold reception circuit. However, two single-phase circuits can also be disposed in parallel as these low-threshold reception circuits 407 and 408. Furthermore, as described in the eighth or ninth embodiment described above, an input signal can have a single phase.

As described above, according to the tenth embodiment of the present technology, even in a case where a differential signal is transmitted, a differential reception circuit that is equivalent to a reception circuit on a reception side detects a level of an output of an output buffer, and therefore a pulse width of a control signal PG can be determined.

11. Eleventh Embodiment

Each of the embodiments described above can be implemented among semiconductor chips in a semiconductor system.

Figure 18:
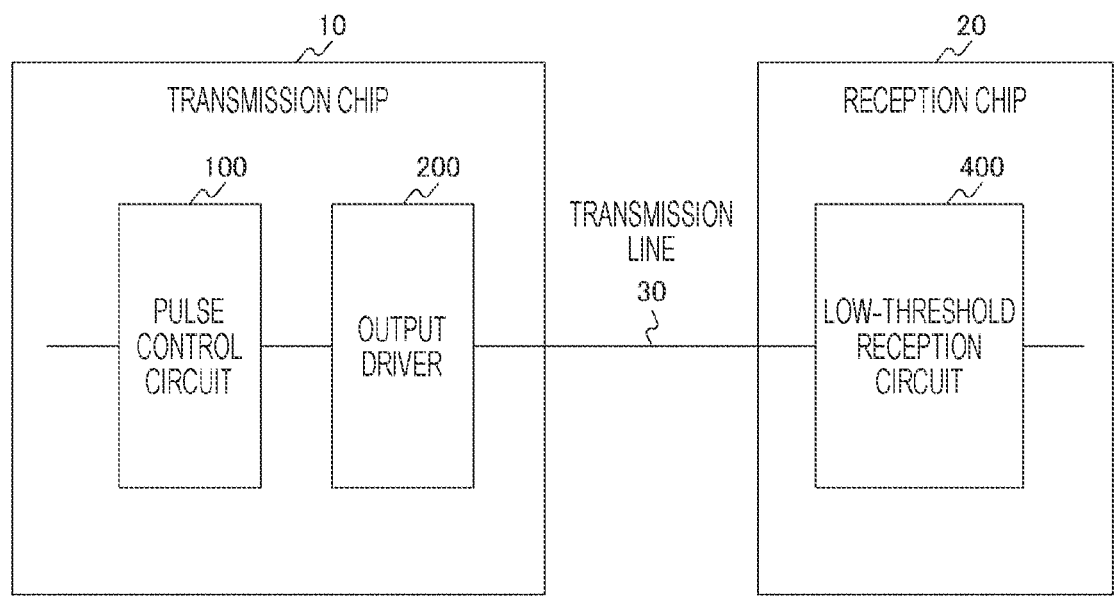
FIG. 18 is a diagram illustrating a configuration example of a semiconductor system according to an eleventh embodiment of the present technology.

FIG. 18 is a diagram illustrating a configuration example of a semiconductor system according to an eleventh embodiment of the present technology.

This semiconductor system has a configuration in which a transmission chip 10 and a reception chip 20 are connected by a transmission line 30. The transmission chip 10 includes, for example, the pulse control circuit 100 and the output driver 200 having a small amplitude according to the first embodiment described above. Furthermore, the reception chip 20 includes, for example, the low-threshold reception circuit 400 according to the third embodiment described above. Note that other embodiments can be combined. Note that the transmission chip 10 is an example of the first semiconductor chip described in the claims. Furthermore, the reception chip 20 is an example of the second semiconductor chip described in the claims.

As described above, according to the eleventh embodiment of the present technology, an amplitude of a signal can be reduced in the transmission line 30 across chips in the semiconductor system, and power consumption can be reduced.

Note that the embodiments described above indicate examples for embodying the present technology, and matters in the embodiments respectively have a correspondence relationship with matters used to specify the invention in the claims. Similarly, the matters used to specify the invention in the claims respectively have a correspondence relationship with matters that have the same names as names of the matters used to specify the invention in the claims in the embodiments of the present technology. However, the present technology is not limited to the embodiments, and can be embodied by making various variations to the embodiments without departing from the scope of the present technology.

Note that the effects described herein are only illustrative and are not restrictive, and other effects may be exhibited.

Note that the present technology can also employ the configurations described below.

(1) A semiconductor circuit including:

a driver that connects a first transistor and a second transistor; and a pulse control circuit that supplies a first control signal and a second control signal to the first transistor and the second transistor, and reduces an output amplitude of the driver, the first control signal and the second control signal being different in a pulse width from each other.

(2) The semiconductor circuit described in (1) described above, in which each of the first control signal and the second control signal includes a signal indicating either a first state or a second state, the first transistor connects a first potential and an output signal line, enters into a disconnection state when the first control signal is in the first state, and enters into a conductive state and changes the output signal line toward the first potential when the first control signal is in the second state, the second transistor connects a second potential and the output signal line, enters into the disconnection state when the second control signal is in the second state, and enters into the conductive state and changes the output signal line toward the second potential when the second control signal is in the first state, and the pulse control circuit supplies the first control signal that has had the pulse width adjusted to cause a period in the second state to be shorter than a period in the first state in the first control signal.

(3) The semiconductor circuit described in (2) described above, in which the pulse control circuit includes:

a delay circuit that delays an input signal by a predetermined period, the input signal indicating either the first state or the second state;

a NAND circuit that generates a NAND of an output of the delay circuit and the input signal, and outputs the NAND as the first control signal; and a logic inversion circuit that inverts a logic of the input signal, and outputs the input signal as the second control signal.

(4) The semiconductor circuit described in (3) described above, in which the pulse control circuit further includes an input signal control circuit that invalidates the input signal to be supplied to the delay circuit in accordance with a predetermined control signal.

(5) The semiconductor circuit described in (3) or (4) described above, in which the pulse control circuit further includes a pulse width setting circuit that specifies the predetermined period of the delay circuit, and sets the pulse width.

(6) The semiconductor circuit described in any of (3) to (5) described above, in which the pulse control circuit further includes a high-impedance compensation circuit that leads an output of the driver to the first potential or the second potential.

(7) The semiconductor circuit described in any of (1) to (6) described above, further including:

a detection circuit that detects that the output amplitude of the driver has reached a predetermined potential, in which the pulse control circuit determines the pulse width according to a timing at which it has been detected that the output amplitude of the driver has reached the predetermined potential.

(8) The semiconductor circuit described in any of (1) to (7) described above, further including:

a second driver that connects a third transistor and a fourth transistor, and outputs a signal having an inverse polarity of a polarity of a signal of the driver, in which the pulse control circuit supplies a third control signal and a fourth control signal to the third transistor and the fourth transistor, and reduces an output amplitude of the second driver, the third control signal and the fourth control signal being different in the pulse width from each other.

(9) A semiconductor circuit including:

a reception circuit that is connected between a first potential and a second potential, and receives an input signal; and a diode that is connected between the reception circuit and the first potential, and lowers a voltage from the first potential.

(10) The semiconductor circuit described in (9) described above, further including:

a supply transistor that is connected in parallel to the diode, and enters into a conductive state and supplies a current from the first potential to the reception circuit when the input signal indicates the second potential.

(11) The semiconductor circuit described in (9) or (10) described above, in which the reception circuit includes an inverter that inverts the input signal.

(12) The semiconductor circuit described in any of (9) to (11) described above, further including:

a latch circuit that latches an output of the reception circuit; and an AND circuit that generates an AND of the output of the reception circuit and the latch circuit, in which the input signal includes a clock signal.

(13) A semiconductor system including a first semiconductor chip and a second semiconductor chip that are connected by a transmission line, in which the first semiconductor chip includes a driver that connects a first transistor and a second transistor, and outputs a signal to the transmission line, and a pulse control circuit that supplies a first control signal and a second control signal to the first transistor and the second transistor, and reduces an output amplitude of the driver, the first control signal and the second control signal being different in a pulse width from each other, and the second semiconductor chip includes a reception circuit that receives a signal from the transmission line, and a diode that is connected between the reception circuit and a power supply, and lowers a voltage from the power supply.

REFERENCE SIGNS LIST

10 Transmission chip
20 Reception chip
30 Transmission line
100 to 103 Pulse control circuit
110 NAND circuit
112 Inverter
120 Pulse width setting circuit
121, 122 Inverter
123 to 126 NAND circuit
130 Delay circuit
131 to 136 Inverter
137 to 139 NAND circuit
150 Inverter
160 NAND circuit
170 High-impedance compensation circuit
190, 191 Inverter
200 Output driver
210 PMOS
220 NMOS
300 Transmission line
400 to 408 Low-threshold reception circuit
411 PMOS
412, 452 NMOS
420 MOS diode
430, 460 PMOS
441 PMOS
442 NMOS
490 Output inverter
501 Latch circuit
510 NOR circuit
521 PMOS
522 NMOS 531, 532 Inverter
540 NAND circuit
550 Inverter

The invention claimed is:

1. A semiconductor circuit, comprising:
a first driver including a first transistor and a second transistor;
a detection circuit configured to detect that an output amplitude of the first driver has reached a determined potential; and
a pulse control circuit configured to:
set a first pulse width of a first control signal and a second pulse width of a second control signal based on a timing at which the output amplitude of the first driver has reached the determined potential, wherein the first pulse width of the first control signal is different from the second pulse width of the second control signal;
supply the first control signal including the set first pulse width to the first transistor and the second control signal including the set second pulse width to the second transistor; and
reduce the output amplitude of the first driver based on the first control signal including the set first pulse width supplied to the first transistor and the second control signal including the set second pulse width supplied to the second transistor.

2. The semiconductor circuit according to claim 1, wherein
each of the first control signal and the second control signal includes a signal,
the signal indicates that each of the first control signal and the second control signal is in one of a first state or a second state,
the first transistor is further configured to:
connect a first potential and an output signal line;
enter into a disconnection state when the first control signal is in the first state;
enter into a conductive state when the first control signal is in the second state; and
change the output signal line toward the first potential when the first control signal is in the second state,
the second transistor is further configured to:
connect a second potential and the output signal line;
enter into the disconnection state when the second control signal is in the second state;
enter into the conductive state when the second control signal is in the first state; and
change the output signal line toward the second potential when the second control signal is in the first state, and
the pulse control circuit is further configured to supply the first control signal including the set first pulse width to the first transistor and the set second pulse width to the second transistor to cause a period in the second state to be shorter than a period in the first state.

3. The semiconductor circuit according to claim 2, wherein the pulse control circuit includes:
a first NAND circuit;
a delay circuit configured to delay an output of the first NAND circuit by a determined period;
a second NAND circuit configured to:
generate a NAND of an output of the delay circuit and an input signal, wherein the input signal indicates one of the first state or the second state; and
output the NAND of the output of the delay circuit and the input signal as the first control signal; and
a logic inversion circuit configured to:
invert a logic of the input signal; and
output the input signal after the inversion as the second control signal.

4. The semiconductor circuit according to claim 3, wherein the first NAND circuit is configured to invalidate the input signal to be supplied to the delay circuit in accordance with a determined control signal.

5. The semiconductor circuit according to claim 3, wherein
the pulse control circuit further includes a pulse width setting circuit, and
the pulse width setting circuit is configured to:
specify the determined period of the delay circuit; and
set the first pulse width of the first control signal and the second pulse width of the second control signal.

6. The semiconductor circuit according to claim 3, wherein
the pulse control circuit further includes a high-impedance compensation circuit, and
the high-impedance compensation circuit is configured to control the first driver such that an output of the first driver is in one of the first potential or the second potential.

7. The semiconductor circuit according to claim 1, further comprising
a second driver including a third transistor and a fourth transistor, wherein
the second driver is configured to output a signal having an inverse polarity of a polarity of a signal of the first driver, and
the pulse control circuit is further configured to:
supply a third control signal including a third pulse width to the third transistor and a fourth control signal including a fourth pulse width to the fourth transistors; and
reduce an output amplitude of the second driver based on the supplied third control signal including the third pulse width and the supplied fourth control signal including the fourth pulse width, wherein the third pulse width of the third control signal is different from the fourth pulse width of the fourth control signal.

8. A semiconductor circuit, comprising:
a reception circuit connected between a first potential and a second potential, wherein
the reception circuit is configured to receive an input signal,
the input signal includes a clock signal, and
the reception circuit includes a diode configured to control the first potential such that the first potential is lower than a specific potential;
a latch circuit configured to latch an output of the reception circuit; and
an AND circuit configured to generate an AND of the output of the reception circuit and an output of the latch circuit.

9. The semiconductor circuit according to claim 8, further comprising:
a supply transistor connected in parallel to the diode, wherein the supply transistor is configured to:
enter into a conductive state when the input signal indicates the second potential; and
supply a current from the first potential to the reception circuit when the input signal indicates the second potential.

10. The semiconductor circuit according to claim 8, wherein the reception circuit includes an inverter configured to invert the input signal.

11. A semiconductor system, comprising:
a first semiconductor chip and a second semiconductor chip that are connected by a transmission line, wherein the first semiconductor chip includes:
- a driver including a first transistor and a second transistor, wherein the driver is configured to output a signal to the transmission line;
- a detection circuit configured to detect that an output amplitude of the driver has reached a determined potential; and
- a pulse control circuit configured to:
  - set a first pulse width of a first control signal and a second pulse width of a second control signal based on a timing at which the output amplitude of the driver has reached the determined potential, wherein the first pulse width of the first control signal is different from the second pulse width of the second control signal;
  - supply the first control signal including the set first pulse width to the first transistor and the second control signal including the set second pulse width to the second transistors; and
  - reduce the output amplitude of the driver based on the first control signal including the set first pulse width supplied to the first transistor and the second control signal including the set second pulse width supplied to the second transistor, and the second semiconductor chip includes
a reception circuit configured to receive the signal from the transmission line, wherein the reception circuit includes a diode configured to lower a voltage outputted from a power supply.

* * * * *